(12) United States Patent
Kajihara et al.

(10) Patent No.: US 10,051,740 B2
(45) Date of Patent: Aug. 14, 2018

(54) WIRING SUBSTRATE AND METHOD FOR MANUFACTURING SAME

(71) Applicant: IBIDEN CO., LTD., Ogaki (JP)

(72) Inventors: Kazuki Kajihara, Ogaki (JP); Naoki Kurahashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/819,133

(22) Filed: Nov. 21, 2017

(65) Prior Publication Data
US 2018/0146554 A1 May 24, 2018

(30) Foreign Application Priority Data

Nov. 21, 2016 (JP) .................. 2016-226038

(51) Int. Cl.
| | |
|---|---|
| H05K 3/40 | (2006.01) |
| H05K 1/11 | (2006.01) |
| H05K 1/14 | (2006.01) |
| H01L 23/498 | (2006.01) |
| H01L 21/48 | (2006.01) |
| H05K 3/46 | (2006.01) |
| H05K 1/02 | (2006.01) |

(52) U.S. Cl.
CPC ......... *H05K 1/144* (2013.01); *H01L 21/4857* (2013.01); *H01L 23/49822* (2013.01); *H05K 1/028* (2013.01); *H05K 1/111* (2013.01); *H05K 1/115* (2013.01); *H05K 3/4007* (2013.01); *H05K 3/4638* (2013.01); *H05K 2201/09063* (2013.01); *H05K 2203/166* (2013.01)

(58) Field of Classification Search
CPC ...... H05K 1/115; H05K 1/116; H05K 3/4038; H05K 3/4046; H05K 3/4061; H05K 3/4069
See application file for complete search history.

(56) References Cited

FOREIGN PATENT DOCUMENTS

JP 2007-088409 A 4/2007

*Primary Examiner* — Jeremy C Norris
(74) *Attorney, Agent, or Firm* — Oblon, McClelland, Maier & Neustadt, L.L.P.

(57) ABSTRACT

A wiring substrate includes a first substrate including a first conductive circuit layer, a second substrate including a second conductive circuit layer, and a substrate fixing structure fixing the first substrate and the second substrate to each other such that the first substrate and the second substrate are superposed on each other. The first conductive layer in the first substrate includes a first counter electrode, the second conductive layer in the second substrate includes a second counter electrode, and the first and second substrates have a hollow space formed such that the first and second counter electrodes are positioned to oppose each other across the hollow space and that the first and second substrates have a dividing plane intersecting the hollow space and dividing the first and second substrates.

20 Claims, 24 Drawing Sheets

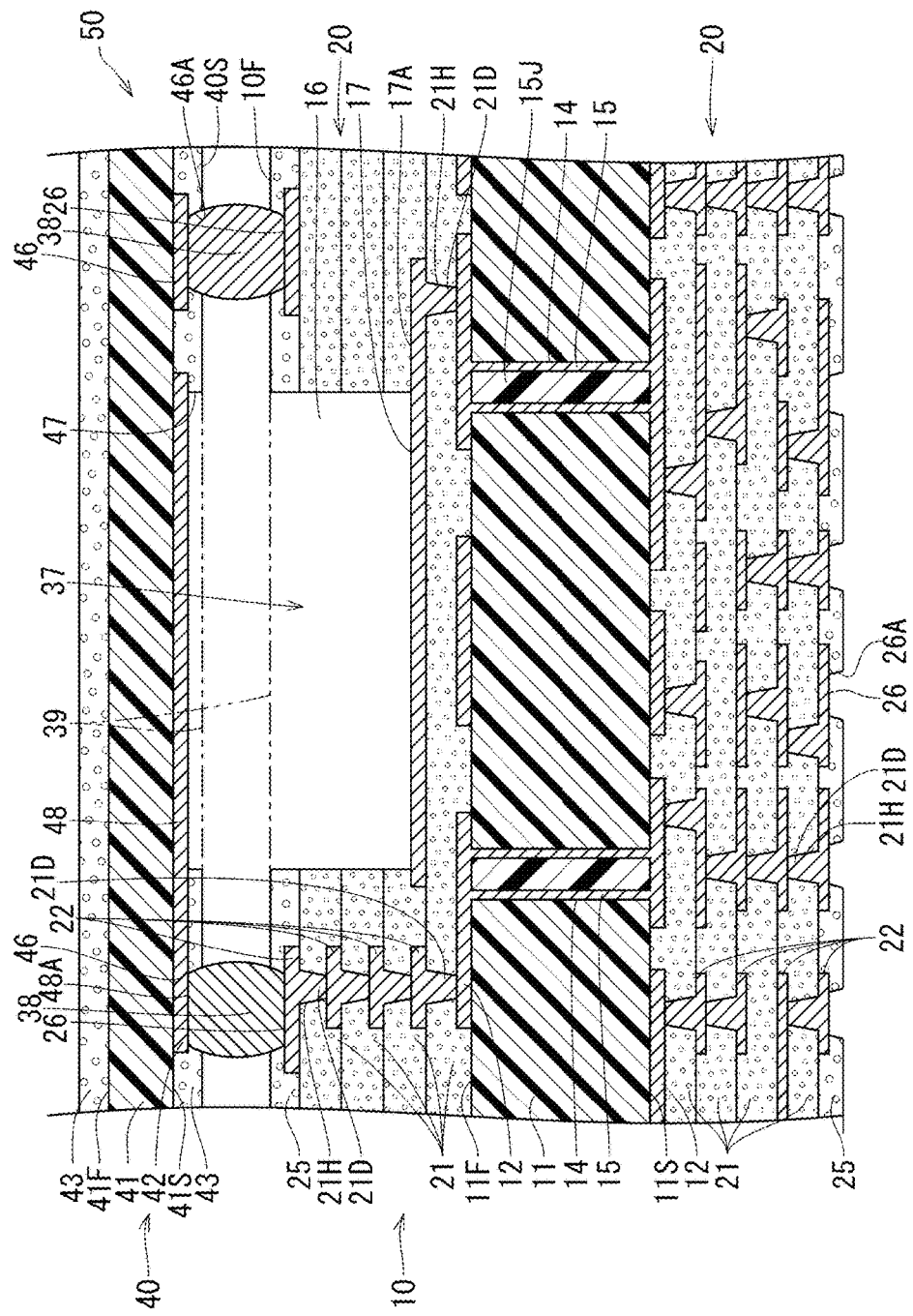

WIRING SUBSTRATE AND METHOD FOR MANUFACTURING SAME

CROSS-REFERENCE TO RELATED APPLICATIONS

The present application is based upon and claims the benefit of priority to Japanese Patent Application No. 2016-226038, filed Nov. 21, 2016, the entire contents of which are incorporated herein by reference.

BACKGROUND OF THE INVENTION

Field of the Invention

The present invention relates to a wiring substrate that includes multiple conductive circuit layers laminated via insulating layers and in which first and second counter electrodes opposing each other are provided in first and second conductive circuit layers among the multiple conductive circuit layers, and relates to a method for manufacturing the wiring substrate.

Description of Background Art

Japanese Patent Laid-Open Publication No. 2007-88409 describes a wiring substrate in which an insulating member sandwiched between a pair of counter electrodes is formed into a porous structure to reduce a dielectric constant. The entire contents of this publication are incorporated herein by reference.

SUMMARY OF THE INVENTION

According to one aspect of the present invention, a wiring substrate includes a first substrate including a first conductive circuit layer, a second substrate including a second conductive circuit layer, and a substrate fixing structure fixing the first substrate and the second substrate to each other such that the first substrate and the second substrate are superposed on each other. The first conductive layer in the first substrate includes a first counter electrode, the second conductive layer in the second substrate includes a second counter electrode, and the first and second substrates have a hollow space formed such that the first and second counter electrodes are positioned to oppose each other across the hollow space and that the first and second substrates have a dividing plane intersecting the hollow space and dividing the first and second substrates.

According to another aspect of the present invention, a method for manufacturing a wiring substrate includes forming a first substrate including a first conductive circuit layer including a first counter electrode, forming a second substrate including a second conductive circuit layer including a second counter electrode, positioning the first substrate and the second substrate such that the first substrate and the second substrate are superposed with respect to each other and form a hollow space between the first and second counter electrodes and a dividing plane intersecting the hollow space, and forming a substrate fixing structure between the first and second substrates such that the substrate fixing structure connects the first and second substrates and fixes the first substrate on a first side of the dividing plane, the second substrate on a second side of the dividing plane on an opposite side with respect to the first side, and the first and second electrodes positioned across the hollow space.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional side view of the wiring substrate;

DETAILED DESCRIPTION OF THE EMBODIMENTS

Figure 1:
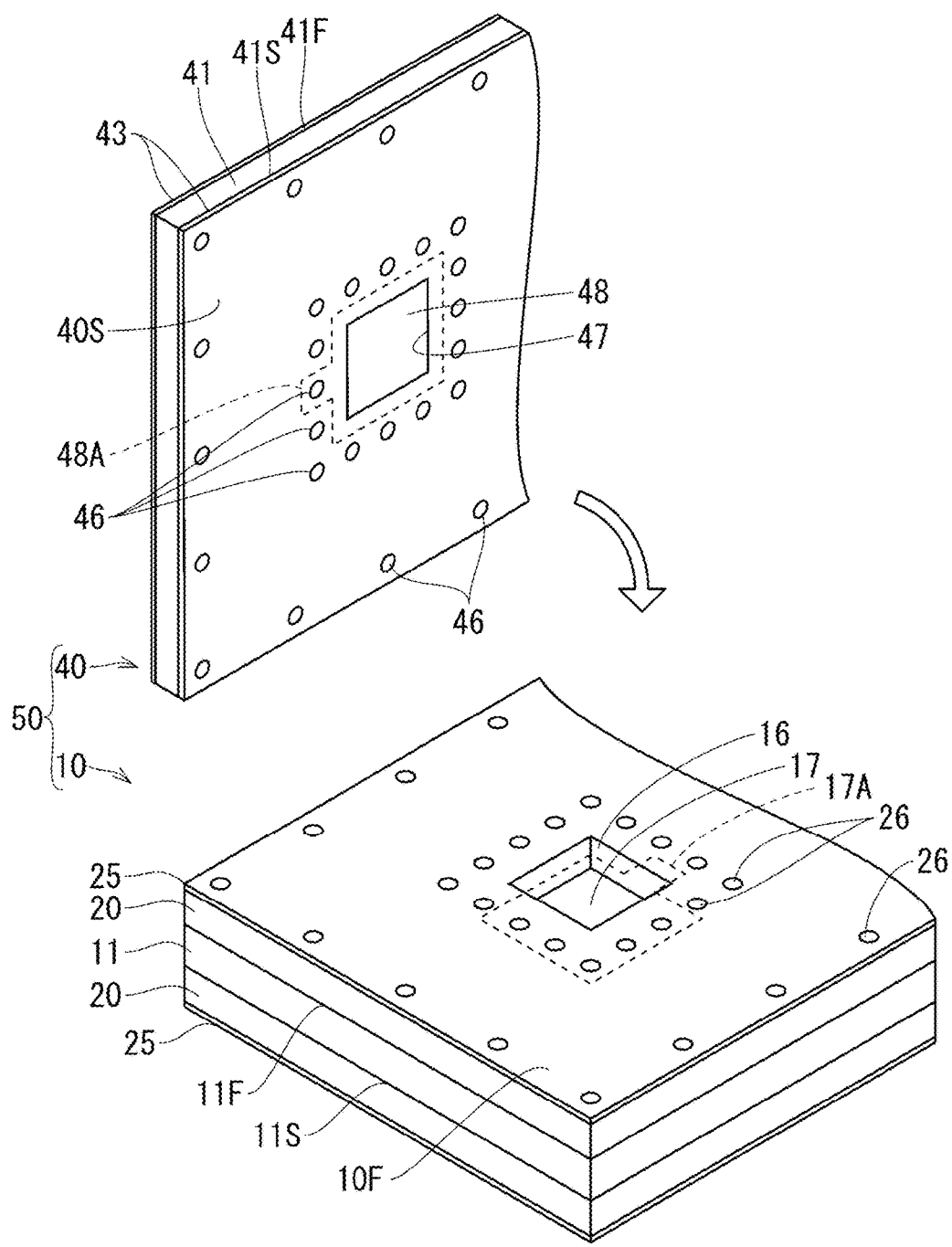
FIG. 1 is an exploded perspective view of a wiring substrate according to a first embodiment of the present invention.

Embodiments will now be described with reference to the accompanying drawings, wherein like reference numerals designate corresponding or identical elements throughout the various drawings.

First Embodiment

In the following, a first embodiment of the present invention is described with reference to FIG. 1-10. A wiring substrate 50 of the present embodiment is formed by superposing a first substrate 10 and a second substrate 40 illustrated in FIG. 1. As illustrated in FIG. 2, the first substrate 10 has a core substrate 11, and build-up layers 20, 20 that are respectively laminated on both front and back side surfaces of the core substrate 11. Further, conductive circuit layers 12 are respectively formed on an F surface (11F), which is the front side surface of the core substrate 11, and an S surface (11S), which is the back side surface of the core substrate 11. Further, in the core substrate 11, multiple through-hole conductors 15 are provided by forming multiple electrical conduction through holes 14 and covering inner peripheral surfaces of the electrical conduction through holes 14 with plating. Then, the conductive circuit layer 12 on the F surface (11F) and the conductive circuit layer 12 on the S surface (11S) are connected to each other by the through-hole conductors 15. A filler (15J) containing a resin and inorganic filler is filled inside the through-hole conductors 15.

Both the front and back build-up layers (20, 20) of the core substrate 11 are each formed by sequentially alternately laminating multiple interlayer insulating layers 21 and multiple conductive circuit layers 22 from the core substrate 11 side, and outermost layers that are most distant from the core substrate 11 are conductive circuit layers 22. Solder resist layers 25 are respectively laminated on the front and back outermost conductive circuit layers (22, 22) of the first substrate 10.

The core substrate 11 has a thickness of 50-300 μm, the interlayer insulating layers 21 each have a thickness of 10-80 μm, and the entire first substrate 10 has a plate thickness of 500-1000 μm.

A cavity 16 for a hollow space is formed in the build-up layer 20 on the F surface (11F) side. The cavity 16 for a hollow space is formed, for example, by removing a portion of the build-up layer 20 on the F surface (11F) side in a shape of a rectangular parallelepiped extending from the second interlayer insulating layer 21 from the core substrate 11 side to the solder resist layer 25, and, as illustrated in FIG. 1, is open to the front side outermost surface of the first substrate 10, that is, to an F surface (10F) of the first substrate 10.

The cavity 16 for a hollow space has, for example, a depth of 80-120 μm, and longitudinal and lateral sizes of 1-10 μm.

As illustrated in FIG. 2, of the build-up layer 20 on the F surface (11F) side, the first conductive circuit layer 22 from the core substrate 11 side corresponds to "a first conductive circuit layer" according to an embodiment of the present invention, and has a first counter electrode 17 according to according to an embodiment the present invention. As illustrated in FIG. 1, the first counter electrode 17 forms, for example, a quadrangular shape that is slightly larger than a planar shape of the cavity 16 for a hollow space. As illustrated in FIG. 2, an entire bottom surface of the cavity 16 for a hollow space is covered by the entire first counter electrode 17 excluding an outer edge portion thereof. Further, the outer edge portion of the first counter electrode 17 is covered by the second interlayer insulating layer 21 from the core substrate 11 side. It is also possible to have a structure in which the first counter electrode 17 covers a portion of the bottom surface of the cavity 16 for a hollow space.

Multiple pad holes (26A) are formed in each of the solder resist layers 25, and pads 26 are respectively formed by portions of the conductive circuit layers 22 positioned in the pad holes (26A). Further, as illustrated in FIG. 1, on the F surface (10F) of the first substrate 10, multiple pads 26 are linearly arrayed along an outer edge portion thereof, and multiple pads 26 are array in a frame shape surrounding the cavity 16 for a hollow space.

As illustrated in FIG. 2, in each of the build-up layers 20, multiple via holes (21H) penetrating the interlayer insulating layers 21 are provided, and via conductors (21D) are formed by filling the via holes (21H) with plating. Due to the via conductors (21D), the conductive circuit layers (22, 22) are connected to each other, and the conductive circuit layers (12, 22) are connected to each other.

In the build-up layer 20 on the F surface (11F) side, for example, an extension part (17A) extending from the first counter electrode 17 and a part of the conductive circuit layer 12 on the F surface (11F) of the core substrate 11 are connected to each other by a via conductor (21D). Further, for example, at a position laterally away from the cavity 16 for a hollow space, multiple via conductors (21D) are vertically formed, and one of the multiple pads 26 surrounding the cavity 16 for a hollow space and a part of the conductive circuit layer 12 on the F surface (11F) of the core substrate 11 are connected to each other.

The second substrate 40 has a structure in which a conductive circuit layer 42 is provided on an S surface (41S), which is a back side surface of a support substrate 41, and both the S surface (41S) and an F surface (41F), which is on an opposite side of the S surface (41S), are respectively covered by solder resist layers (43, 43). Further, the second substrate 40 has the same planar shape (for example, a quadrangular shape) as the first substrate 10, and the entire F surface (10F) of the first substrate 10 and the entire S surface (40S) of the second substrate 40 are superposed on each other. The second substrate 40 does not have any other conductive circuit layer than the conductive circuit layer 42 on the S surface (41S). Further, the second substrate 40 as a whole has a plate thickness of, for example, 30-100 μm, and is thinner than the above-described core substrate 11.

The conductive circuit layer 42 of the second substrate 40 corresponds to "a second conductive circuit layer" according to an embodiment of the present invention, and has a second counter electrode 48 opposing the first counter electrode 17 of the first substrate 10. As illustrated in FIG. 1, the second counter electrode 48 has the same planar shape, for example, a quadrangular shape, as the first counter electrode 17. Further, in the solder resist layer 43 on the S surface (41S) side, an opening part 47 having the same planar shape as the cavity 16 for a hollow space of the first substrate 10 is formed. Then, as illustrated in FIG. 2, a hollow space part 37 according to an embodiment of the present invention is formed including the cavity 16 for a hollow space and the opening part 47, and the first counter electrode 17 and the second counter electrode 48 oppose each other across a gas in the hollow space part 37. It is also possible that the opening part 47 does not have the same planar shape as the cavity 16 for a hollow space and a portion of the second counter electrode 48 opposing the cavity 16 for a hollow space is covered by the solder resist layer 43. Further, it is also possible that the opening part 47 is not formed and the entire second counter electrode 48 is covered by the solder resist layer 43.

In the solder resist layer 43 on the S surface (41S) side, multiple tapered pad holes (46A) are formed, and multiple pads 46 are respectively formed by portions of the conductive circuit layer 42 positioned in these pad holes (46A). Further, as illustrated in FIG. 1, these multiple pads 46 are respectively formed at positions opposing the multiple pads 26 on the F surface (10F) of the first substrate 10. That is, the multiple pads 46 are formed along an outer edge portion of the S surface (40S) of the second substrate 40 and are arrayed so as to surround the opening part 47. Further, one of the pads 46 surrounding the opening part 47 is formed by an extension part (48A) extending from the second counter electrode 48. As illustrated in FIG. 2, in a state in which a gap is formed between the S surface (40S) of the second substrate 40 and the F surface (10F) of the first substrate 10, the pads (26, 46) opposing each other are connected to each other by solders 38 (corresponding to "a substrate fixing part" according to an embodiment of the present invention).

In the present embodiment, since the wiring substrate 50 can be divided into the first substrate 10 and the second substrate 40 by the F surface (10F) of the first substrate 10, or the S surface (40S) of the second substrate 40, or any imaginary plane between the F surface (10F) and the S surface (40S), any one of the F surface (40F), the S surface (10S), and any imaginary plane between the F surface (10F) and the S surface (40S) corresponds to a dividing plane 39 (see FIG. 2). Further, the conductive circuit layers 12 and the conductive circuit layers 22 of the first substrate 10 and the conductive circuit layer 42 of the second substrate 40 correspond to "multiple conductive circuit layers" according to an embodiment of the present invention, and the core substrate 11, the interlayer insulating layers 21 and the solder resist layers (25, 43) and the like positioned between these conductive circuit layers correspond to "insulating layers" according to an embodiment of the present invention.

The description about the structure of the wiring substrate 50 is as given above. Next, a method for manufacturing the wiring substrate 50 is described. The first substrate 10 of the wiring substrate 50 is manufactured as follows.

Figure 3A:
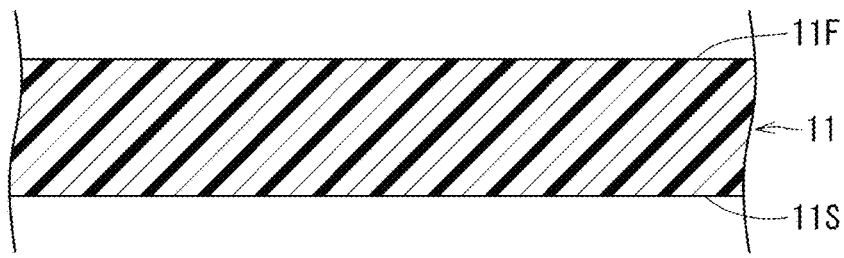
FIG. 3A-3D are cross-sectional side views illustrating manufacturing processes of a first substrate.

(1) As illustrated in FIG. 3A, as the core substrate 11, a prepreg is prepared, a copper foil (not illustrated in the drawings) being laminated on both the F surface (11F) and the S surface (11S). The prepreg is formed of an epoxy resin or a BT (bismaleimide triazine) resin and a reinforcing material such as a glass cloth.

Figure 3B:
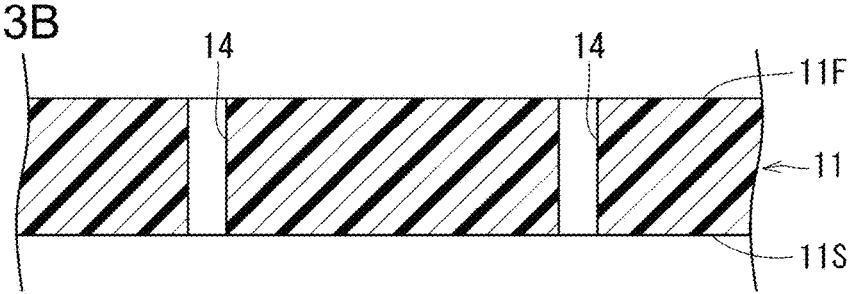

(2) As illustrated in FIG. 3B, the electrical conduction through holes 14 are formed in the core substrate 11 by, for example, irradiating CO2 laser or pressing a drill or a router.

(3) An electroless plating treatment is performed. An electroless plating film (not illustrated in the drawings) is formed on the copper foil on the F surface (11F) and the S surface (11S) and on inner surfaces of the electrical conduction through holes 14.

Figure 3C:
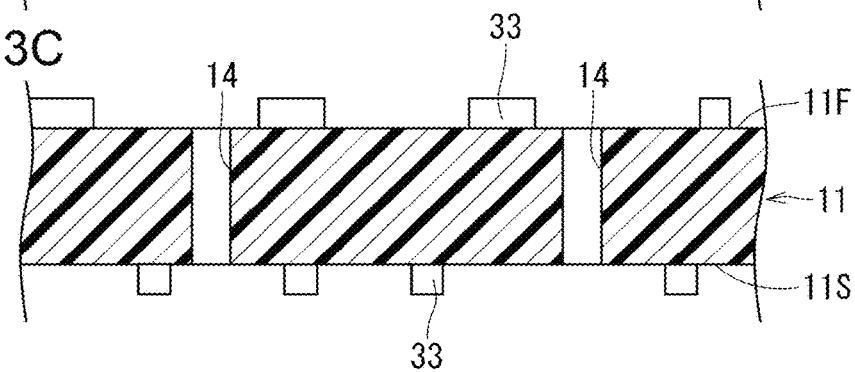

(4) As illustrated in FIG. 3C, a plating resist 33 of a predetermined pattern is formed on the electroless plating film on the F surface (11F) and the S surface (11S).

Figure 3D:
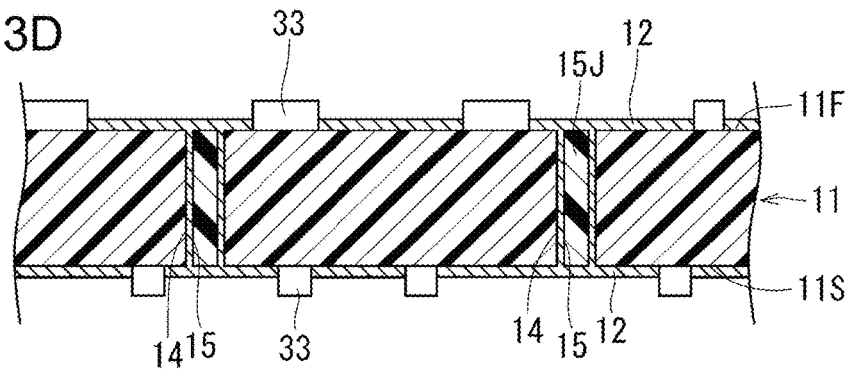

(5) An electrolytic plating treatment is performed. The through-hole conductors 15 are formed by covering the inner side surfaces of the electrical conduction through holes 14 with electrolytic plating, and, of the electroless plating film (not illustrated in the drawings) on the F surface (11F) and the S surface (11S), portions exposed from the plating resist 33 are covered by an electrolytic plating film. Then, the filler (15J) containing a resin and inorganic filler is filled inside the through-hole conductors 15, and is cured. Thereafter, surface polishing is performed. Further, an electroless plating treatment and an electrolytic plating treatment are repeated and, as illustrated in FIG. 3D, the filler (15J) is covered by an electrolytic plating film.

Figure 4A:
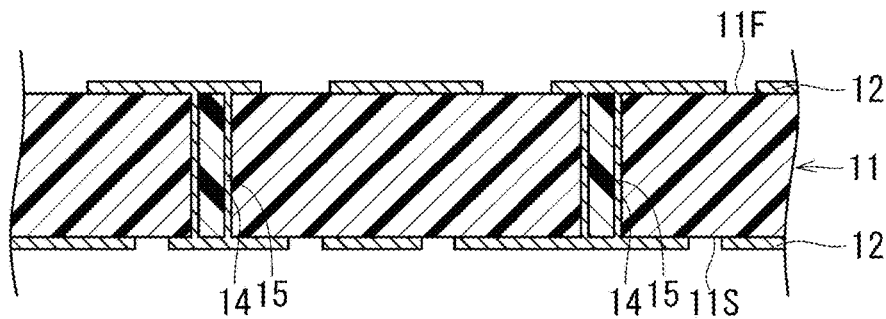
FIG. 4A-4D are cross-sectional side views illustrating manufacturing processes of the first substrate.

(6) As illustrated in FIG. 4A, the plating resist 33 is peeled off and the electroless plating film and the copper foil below the plating resist 33 are removed, and the conductive circuit layers (12, 12) are respectively formed on the F surface (11F) and the S surface (11S). In this way, the conductive circuit layers (12, 12) are formed using a semi-additive method described in (3)-(6). Further, the two conductive circuit layers (12, 12) are connected to each other by the through-hole conductors 15.

Figure 4B:
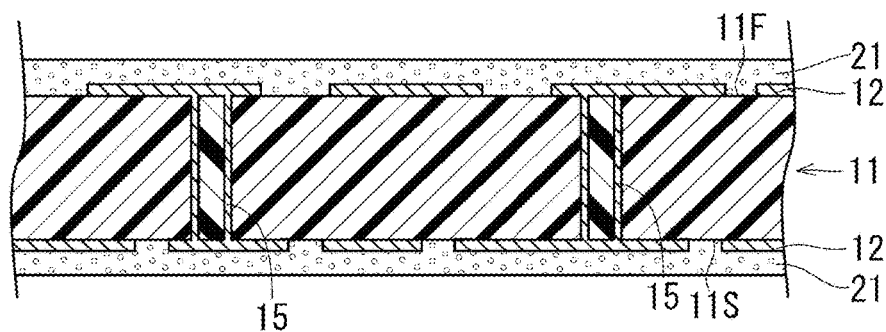

(7) As illustrated in FIG. 4B, prepregs as the first interlayer insulating layers (21, 21) and copper foils (not illustrated in the drawings) are laminated on the conductive circuit layers (12, 12) on the F surface (11F) and the S surface (11S), and thereafter, the resulting substrate is hot-pressed.

Figure 4C:
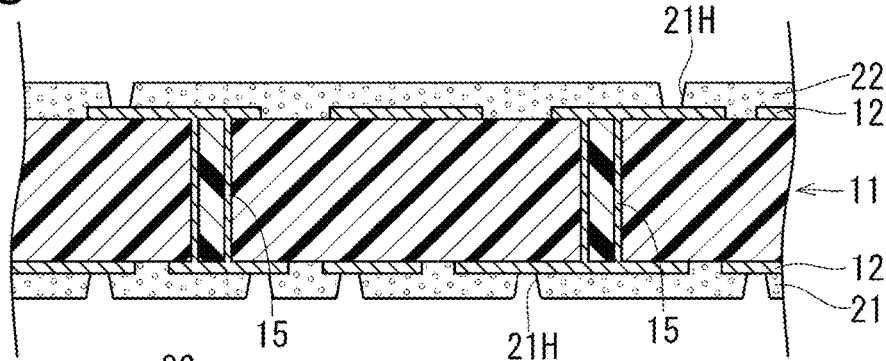

(8) As illustrated in FIG. 4C, CO2 laser is irradiated to the first interlayer insulating layers (21, 21), and the multiple via holes (21H) are formed.

(9) An electroless plating treatment is performed. An electroless plating film (not illustrated in the drawings) is formed on the copper foils on the first interlayer insulating layers (21, 21) and on inner surfaces of the via holes (21H).

Figure 4D:
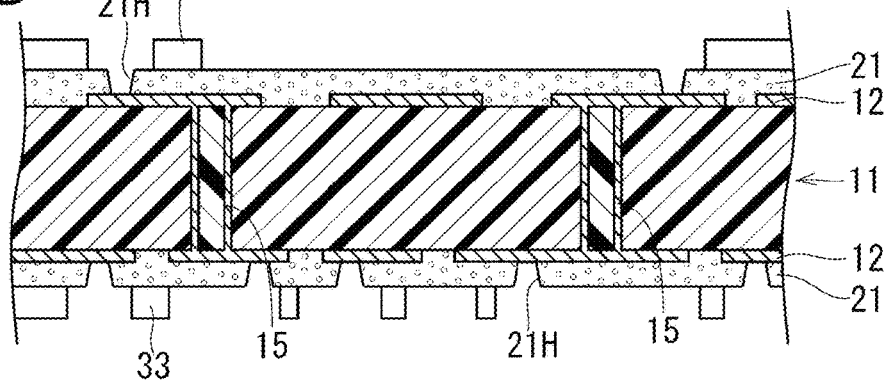

(10) As illustrated in FIG. 4D, a plating resist 33 of a predetermined pattern is formed on the electroless plating film on the first interlayer insulating layers (21, 21).

Figure 5A:
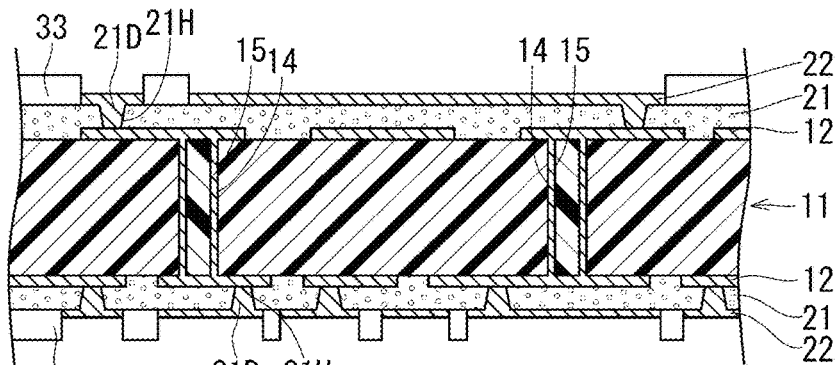
FIG. 5A-5D are cross-sectional side views illustrating manufacturing processes of the first substrate.

(11) An electrolytic plating treatment is performed. As illustrated in FIG. 5A, the via holes (21H) are filled with electrolytic plating and the via conductors (21D) are formed, and portions of the electroless plating film on the first interlayer insulating layers (21, 21) are covered by an electrolytic plating film, the portions being exposed from the plating resist 33.

Figure 5B:
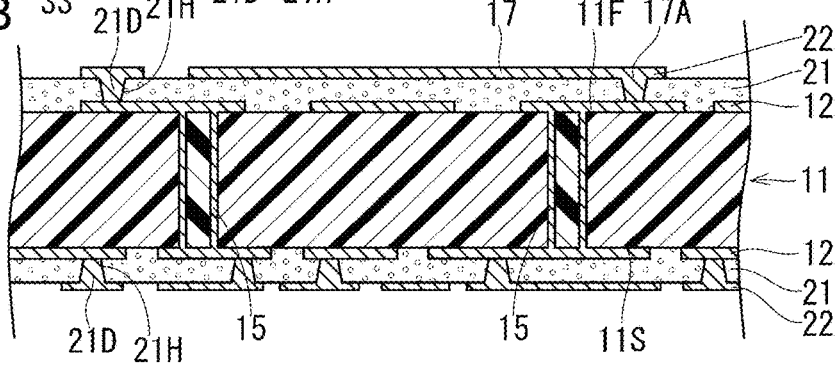

(12) As illustrated in FIG. 5B, the plating resist 33 is peeled off and the electroless plating film (not illustrated in the drawings) and the copper foil below the plating resist 33 are removed, and the first conductive circuit layers (22, 22) are respectively formed on the first interlayer insulating layers (21, 21). In this way, the conductive circuit layers (22, 22) are formed using a semi-additive method described in (9)-(11).

Figure 5C:
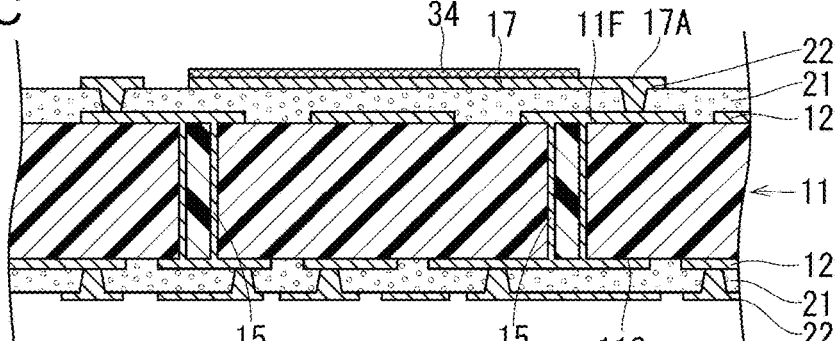

(13) As illustrated in FIG. 5C, a release sheet 34 is laminated on the entire first conductive circuit layer 22 on the F surface (11F) excluding the extension part (17A) of the first counter electrode 17.

Figure 5D:
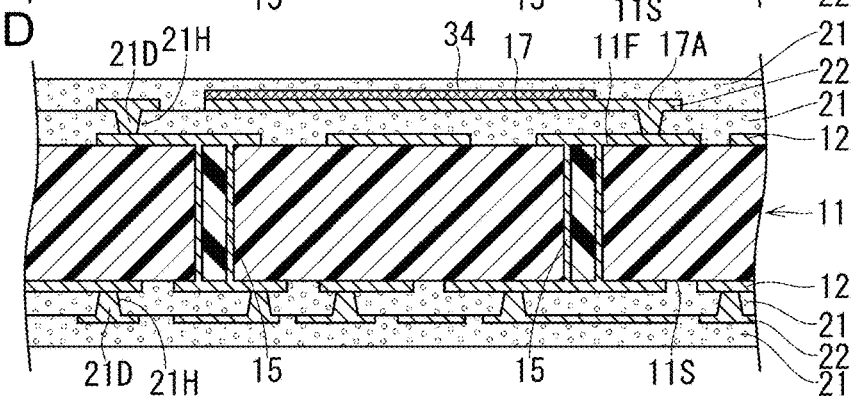
Figure 6A:
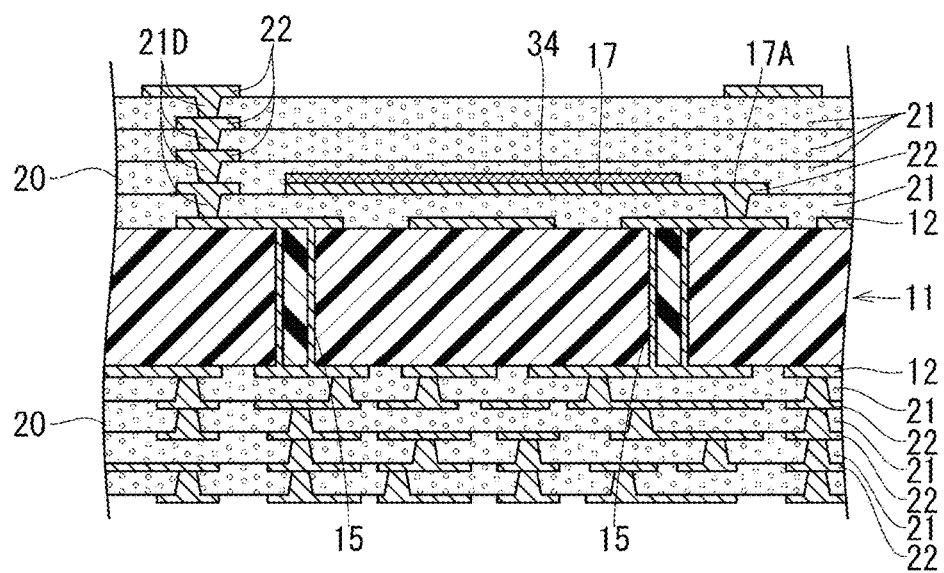
FIGS. 6A and 6B are cross-sectional side views illustrating manufacturing processes of the first substrate.

(14) As illustrated in FIG. 5D, prepregs as the second interlayer insulating layers (21, 21) and copper foils (not illustrated in the drawings) are laminated on the first conductive circuit layers (22, 22) on the F surface (11F) and the S surface (11S), and thereafter, the resulting substrate is hot-pressed. Then, by repeating the same processes as those of (8)-(12) multiple times, as illustrated in FIG. 6A, multiple interlayer insulating layers 21 and multiple conductive circuit layers 22 are alternatively laminated on both the F surface (11F) and the S surface (11S) of the core substrate 11, and the build-up layers (20, 20) are formed.

Figure 6B:
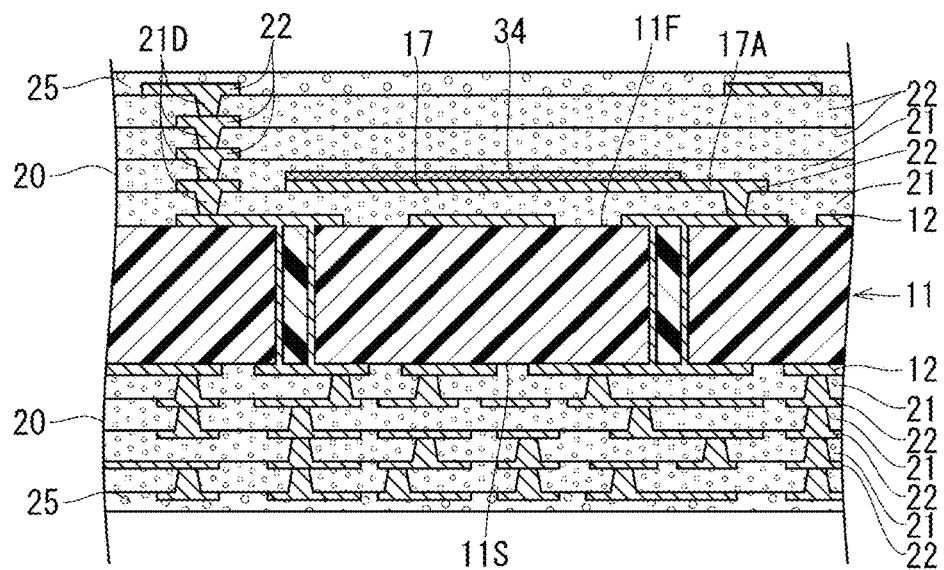

(15) As illustrated in FIG. 6B, the solder resist layers (25, 25) are respectively laminated on outermost surfaces of the two build-up layers (20, 20).

Figure 7A:
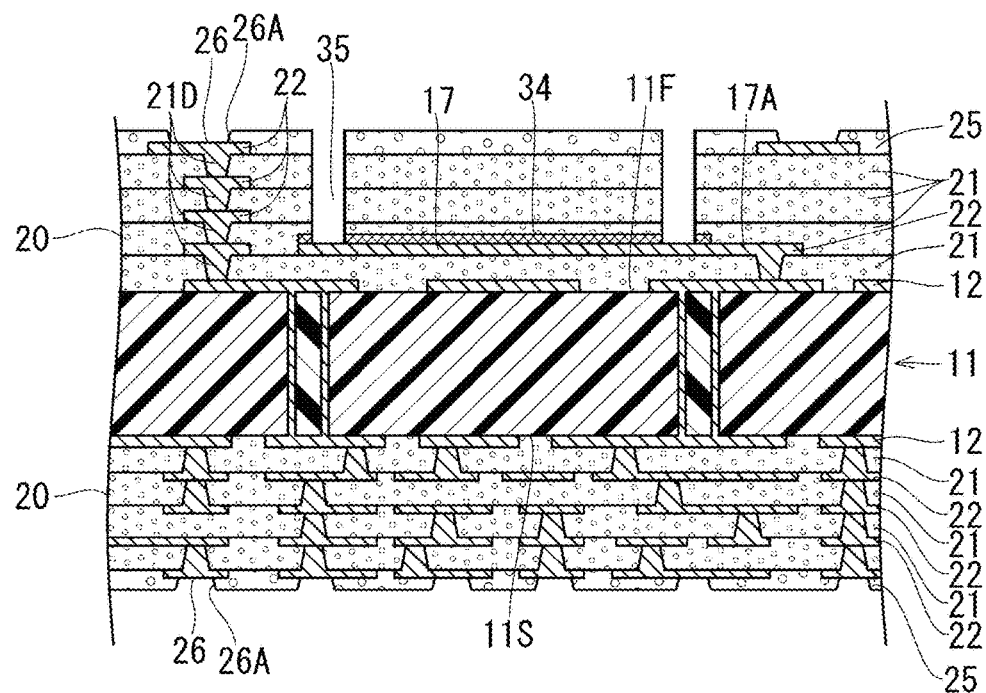
FIGS. 7A and 7B are cross-sectional side views illustrating manufacturing processes of the first substrate.

(16) As illustrated in FIG. 7A, CO2 laser is irradiated to predetermined places of the two solder resist layers (25, 25) and the multiple pad holes (26A) are formed, and the pads 26 are formed inside the pad holes (26A). Further, a frame-shaped groove 35 reaching the first conductive circuit layer 22 from the solder resist layer 25 on the F surface (11F) side is formed along an outer edge portion of the first counter electrode 17 using CO2 laser.

Figure 7B:
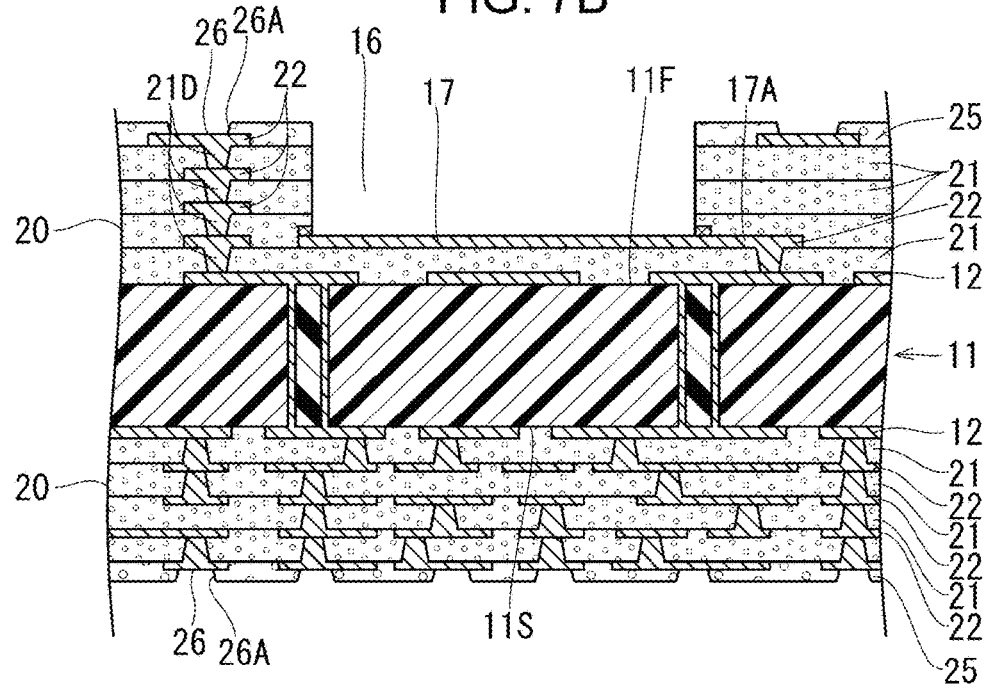

(17) As illustrated in FIG. 7B, of the build-up layer 20 on the F surface (11F) side, a portion that is on an inner side of the frame-shaped groove 35 and is above the release sheet 34 is peeled off from the first counter electrode 17 and is removed, and the cavity 16 for a hollow space is formed.

(18) On each of the pads 26, a nickel layer, a palladium layer and a gold layer are laminated in this order and a metal film (not illustrated in the drawings) is formed. As a result, the first substrate 10 is completed.

The second substrate 40 of the wiring substrate 50 is manufactured as follows.

Figure 8A:
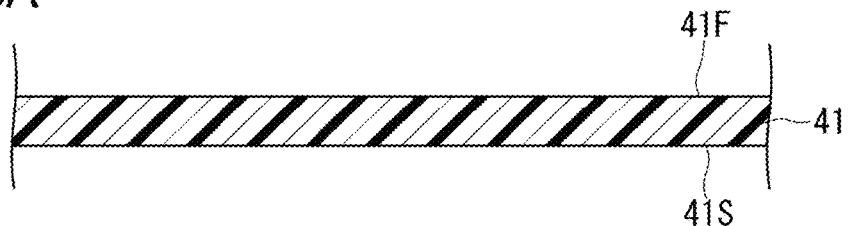
FIG. 8A-8F are cross-sectional side views illustrating manufacturing processes of a second substrate.

(19) As illustrated in FIG. 8A, as the support substrate 41, a prepreg is prepared, a copper foil (not illustrated in the drawings) being laminated on the S surface (41S).

Figure 8B:
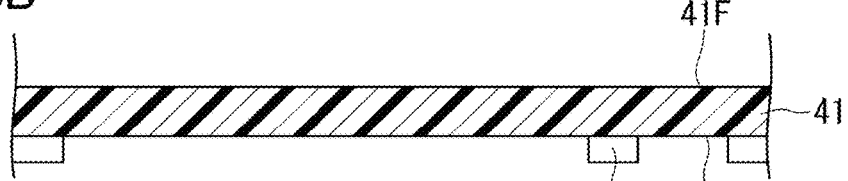

(20) As illustrated in FIG. 8B, a plating resist 49 of a predetermined pattern is formed on the copper foil on the S surface (41S).

Figure 8C:
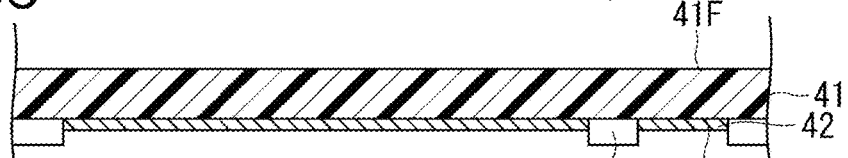

(21) An electrolytic plating treatment is performed. As illustrated in FIG. 8C, of the copper foil on the S surface (41S), a portion exposed from the plating resist 49 is covered by an electrolytic plating film.

Figure 8D:
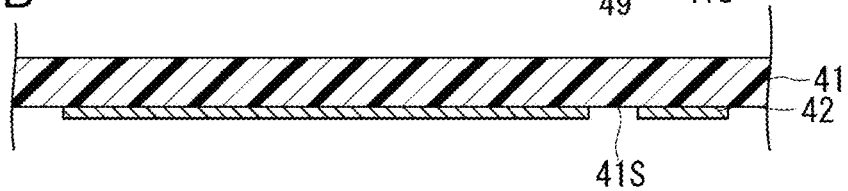

(22) The plating resist 49 is peeled off and the copper foil below the plating resist 49 is removed. As illustrated in FIG. 8D, the conductive circuit layer 42 is formed on the S surface (41S).

Figure 8E:
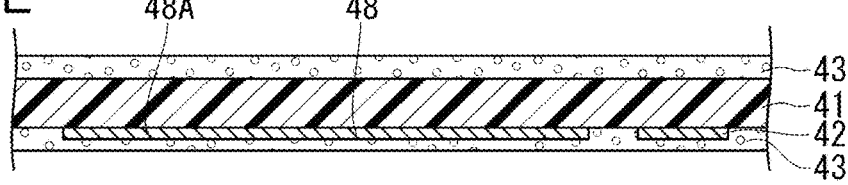
Figure 8F:
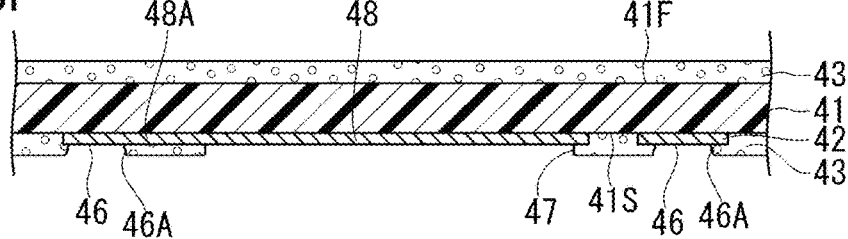

(23) As illustrated in FIG. 8E, the solder resist layers (43, 43) are respectively laminated on the F surface (41F) and the S surface (41S) of the support substrate 41.

(24) As illustrated in FIG. 8E, CO2 laser is irradiated to predetermined places of the solder resist layer (43) and the multiple pad holes (46A) are formed, and the pads 46 are formed inside the pad holes (46A). Further, of the solder resist layer 43 on the S surface (41S) side, a portion laminated on an inner side of an outer edge portion of the second counter electrode 48 in the conductive circuit layer 42 is removed using CO2 laser, and the opening part 47 is formed.

(25) On each of the pads 46, a nickel layer, a palladium layer and a gold layer are laminated in this order and a metal film (not illustrated in the drawings) is formed. As a result, the second substrate 40 is completed.

The wiring substrate 50 is manufactured as follows by connecting the first substrate 10 and the second substrate 40 that are separately manufactured as described above.

Figure 9:
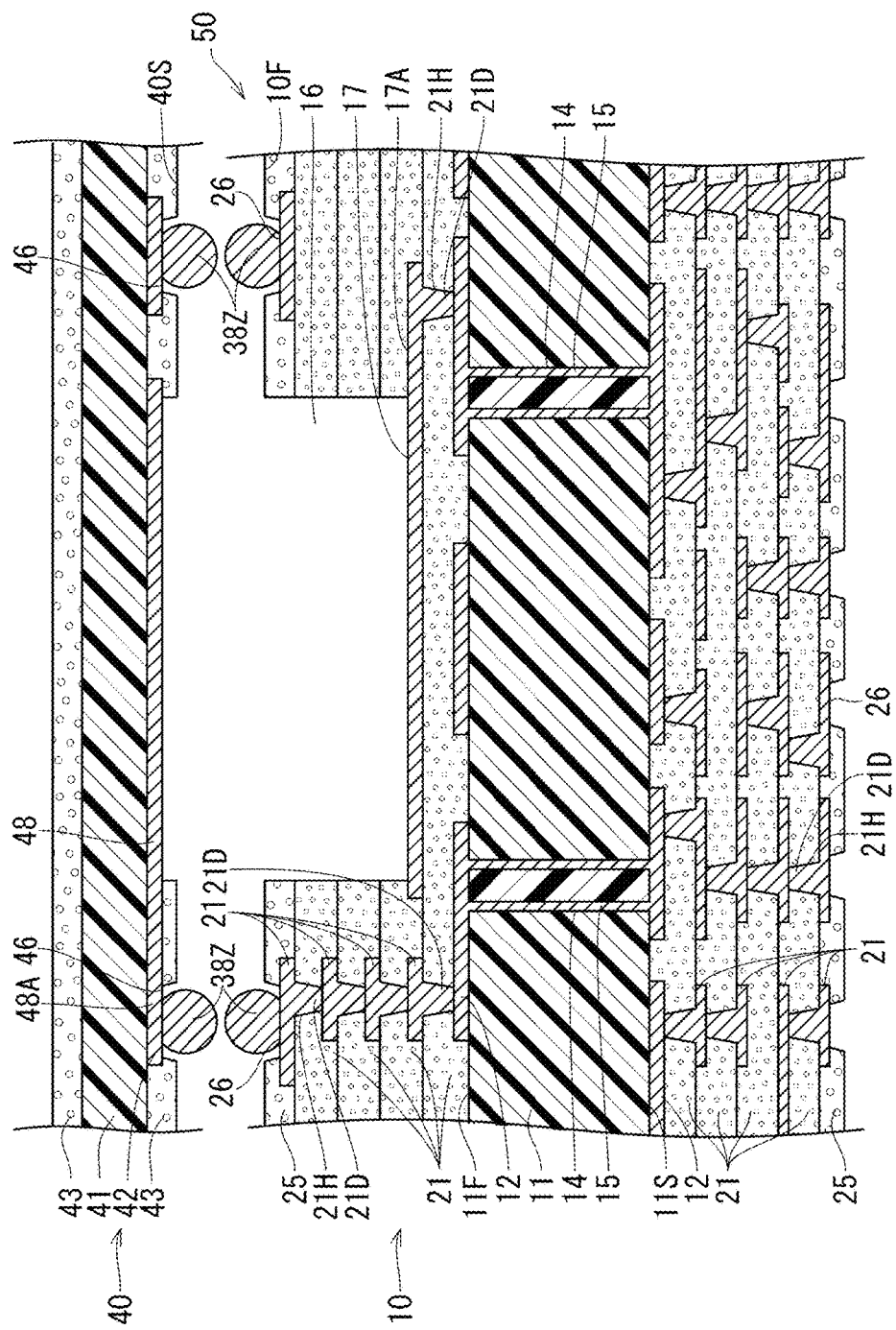
FIG. 9 is a cross-sectional side view of the first substrate and the second substrate.

(26) As illustrated in FIG. 9, solder balls (38Z) are respectively soldered to the multiple pads 26 on the F surface (10F) of the first substrate 10 and to the multiple pads 46 on the S surface (40S) of the second substrate 40.

(27) Heat is applied while the S surface (40S) of the second substrate 40 is superposed on the F surface (10F) of the first substrate 10 and the second substrate 40 is pressed toward the first substrate 10 side. As a result, the first substrate 10 and the second substrate 40 are fixed by the solders 38, and a circuit of the first substrate 10 and a circuit (specifically, the first counter electrode 17) of the second substrate 40 are electrically connected to each other by some of the pads (26, 46) and the solders 38 between the some of the pads (26, 46), and the wiring substrate 50 illustrated in FIG. 2 is completed.

Figure 10:
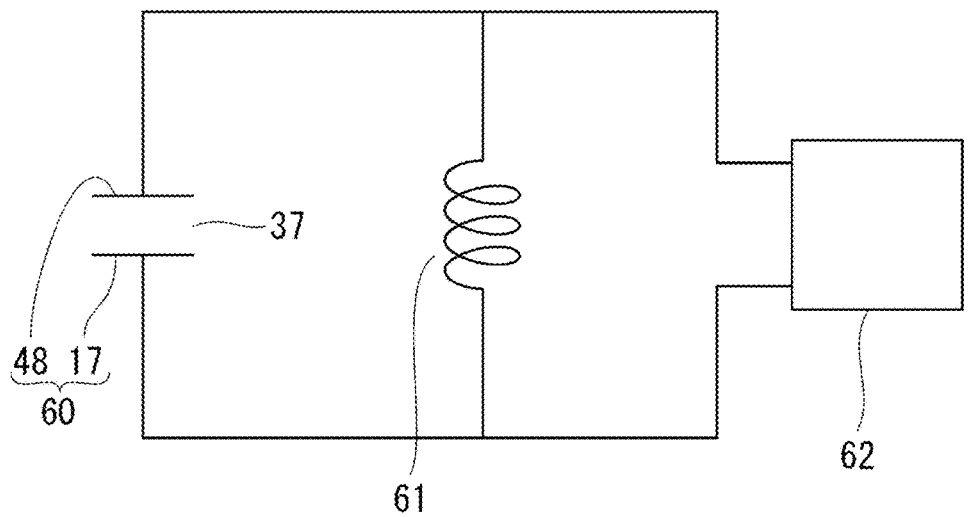
FIG. 10 is a circuit diagram illustrating an example of use of first and second counter electrodes.

Next, an example of use and an operation effect of the wiring substrate 50 of the present embodiment are described. For example, the first and second counter electrodes (17, 48) of the wiring substrate 50 are used as a capacitive antenna. Specifically, for example, as illustrated in FIG. 10, a capacitor 60 is formed by the first and second counter electrodes (17, 48), and the capacitor 60 and a coil 61 are connected in parallel between a pair of inputs of a receiving circuit 62. Therefore, for example, either the coil 61 is printed in a predetermined conductive circuit layer 22 of the first substrate 10 or the coil 61 as an element is mounted on the S surface (10S) of the first substrate 10. Further, the receiving circuit 62 is formed by a printed circuit in a predetermined conductive circuit layer 22 and a semiconductor chip or the like mounted on the S surface (10S) side of the first substrate 10. Then, the first and second counter electrodes (17, 48) are connected to the coil 61 and the receiving circuit 62 via the via conductors (21D), the through-hole conductors 15, and the conductive circuit layers 22 and the like. Thereby, the circuit illustrated in FIG. 10 is formed, and the first and second counter electrodes (17, 48) are used as the capacitive antenna.

Here, a lower dielectric constant of a material between the first and second counter electrodes (17, 48) forming the capacitive antenna allows energy loss of transmission and reception waves via the capacitive antenna to be more suppressed. Further, for a higher frequency, a ratio of noise waves to normal waves becomes larger, and suppression of energy loss is more demanded. In particular, when wireless communication is performed in a high frequency band of 5-73 GHz, influence of noise waves cannot be sufficiently suppressed by using a porous interlayer insulating resin as the material between the first and second counter electrodes (17, 48). In contrast, in the wiring substrate 50 of the present embodiment, the material between the first and second counter electrodes (17, 48) is mostly air (or other gasses) in the hollow space part 37 and has a lower dielectric constant as compared to a porous interlayer insulating resin. As a result, when the wiring substrate 50 of the present embodiment is used, energy loss of transmission and reception waves is suppressed and influence of noise is also suppressed.

As a structure in which the hollow space part 37 is provided between the first and second counter electrodes (17, 48), for example, it may be possible to have a structure in which the wiring substrate 50 is formed by only the above-described first substrate 10, and the first and second counter electrodes (17, 48) are respectively provided in two conductive circuit layers (22, 22) included in one of the build-up layers 20 of the first substrate 10 and the hollow space part 37 is provided by removing the interlayer insulating layer 21 between the first and second counter electrodes (17, 48). However, in this case, there may be a problem that, during a manufacturing process of the wiring substrate 50, when the cavity 16 for a hollow space (see FIG. 2) as the hollow space part 37 is covered by a prepreg as an interlayer insulating layer 21 and the resulting substrate is hot-pressed, the prepreg of a B-stage may fall into the hollow space part 37. Further, there may be also a problem that the prepreg positioned above the cavity 16 for a hollow space may be damaged by pressing.

In contrast, the wiring substrate 50 of the present embodiment is divided into the first substrate 10 and the second substrate 40, and the dividing plane 39 is set at a position intersecting the hollow space part 37. As a result, as in the manufacturing method described above, the wiring substrate 50 is divided into the first substrate 10 and the second substrate 40, which are separately manufactured, and the hollow space part 37 can be formed by superposing the first substrate 10 and the second substrate 40. Therefore, the above-described problem that the prepreg falls into the hollow space part 37 is eliminated. Further, a pressure required for reflow can be smaller than a pressure required in hot-pressing during lamination. Therefore, NG products due to a damage to the second wiring substrate 40 positioned above the cavity 16 for a hollow space can also be reduced. That is, according to the wiring substrate 50 and the method for manufacturing the wiring substrate 50 of the present embodiment, the wiring substrate 50 having the hollow space part 37 between the first and second counter electrodes (17, 48) can be easily manufactured.

Second Embodiment

Figure 11:
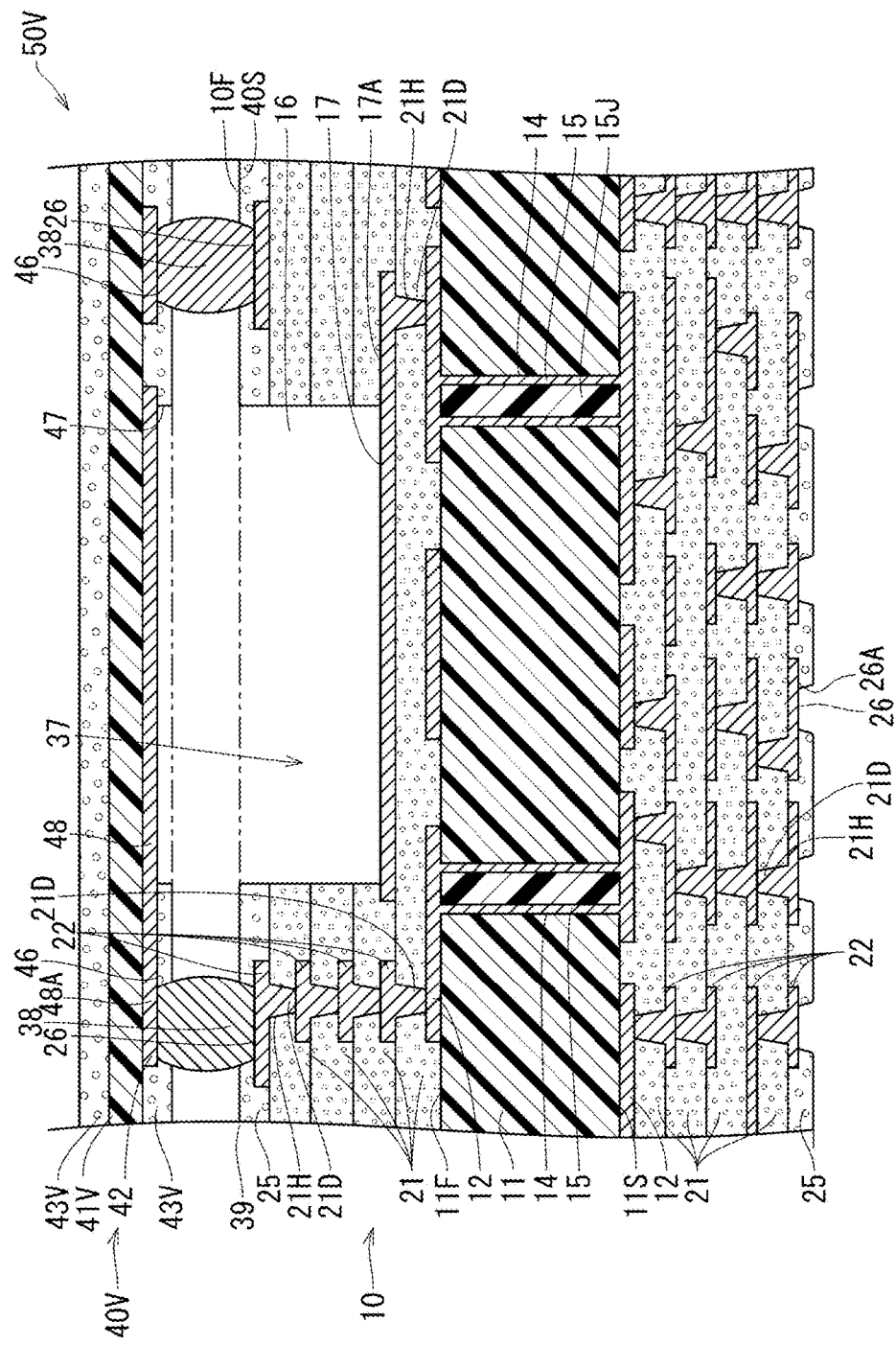
FIG. 11 is a cross-sectional side view of a wiring substrate according to a second embodiment.

The present embodiment is illustrated in FIG. 11. This wiring substrate (50V) has a structure in which, instead of the second substrate 40 of the first embodiment, a second substrate (40V), which is a flexible substrate, is provided. That is, the wiring substrate 50 of the first embodiment is formed by superposing the first substrate 10 and the second substrate 40, which are both rigid substrates. However, the wiring substrate (50V) of the present embodiment is a rigid and flexible substrate that is formed by superposing the first substrate 10, which is a rigid substrate, and the second substrate (40V), which is a flexible substrate. The entire second substrate (40V) has a thickness of, for example, 30-100 μm. Instead of laminating the solder resist layers 43, coverlays (43V) are respectively laminated on both sides of a support substrate 41 of the second substrate (40V) via an adhesive (not illustrated in the drawings).

Third Embodiment

Figure 12:
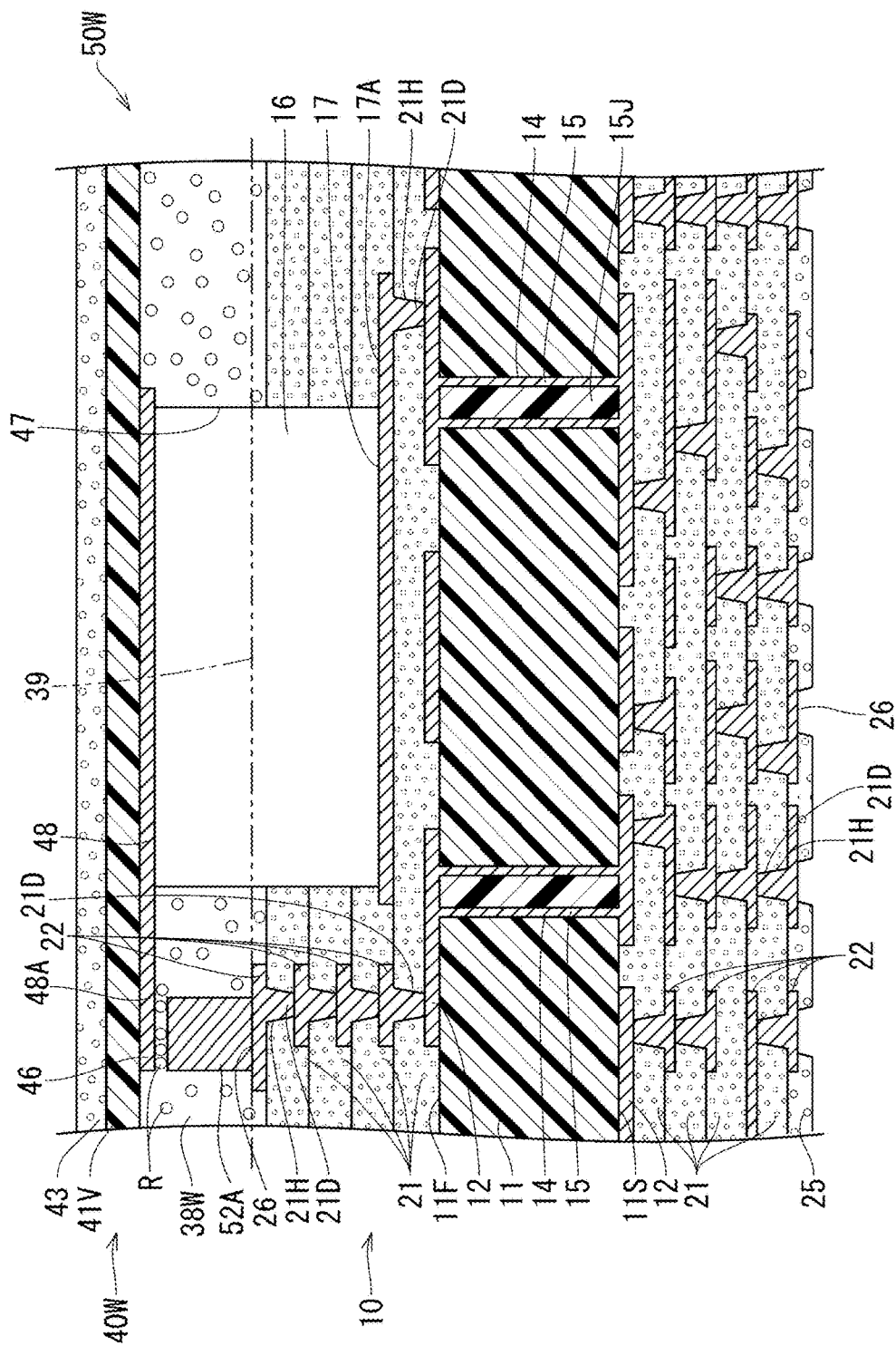
FIG. 12 is a cross-sectional side view of a wiring substrate according to a third embodiment.

The present embodiment is illustrated in FIG. 12-15. In the wiring substrate (50V) of the second embodiment, the first substrate 10 and the second substrate (40V) are fixed to each other by the solders 38. However, a wiring substrate (50W) of the present embodiment is different in that, as illustrated in FIG. 12, the first substrate 10 and a second substrate (40W) are fixed to each other by an anisotropic conductive adhesive layer (38W).

Figure 13:
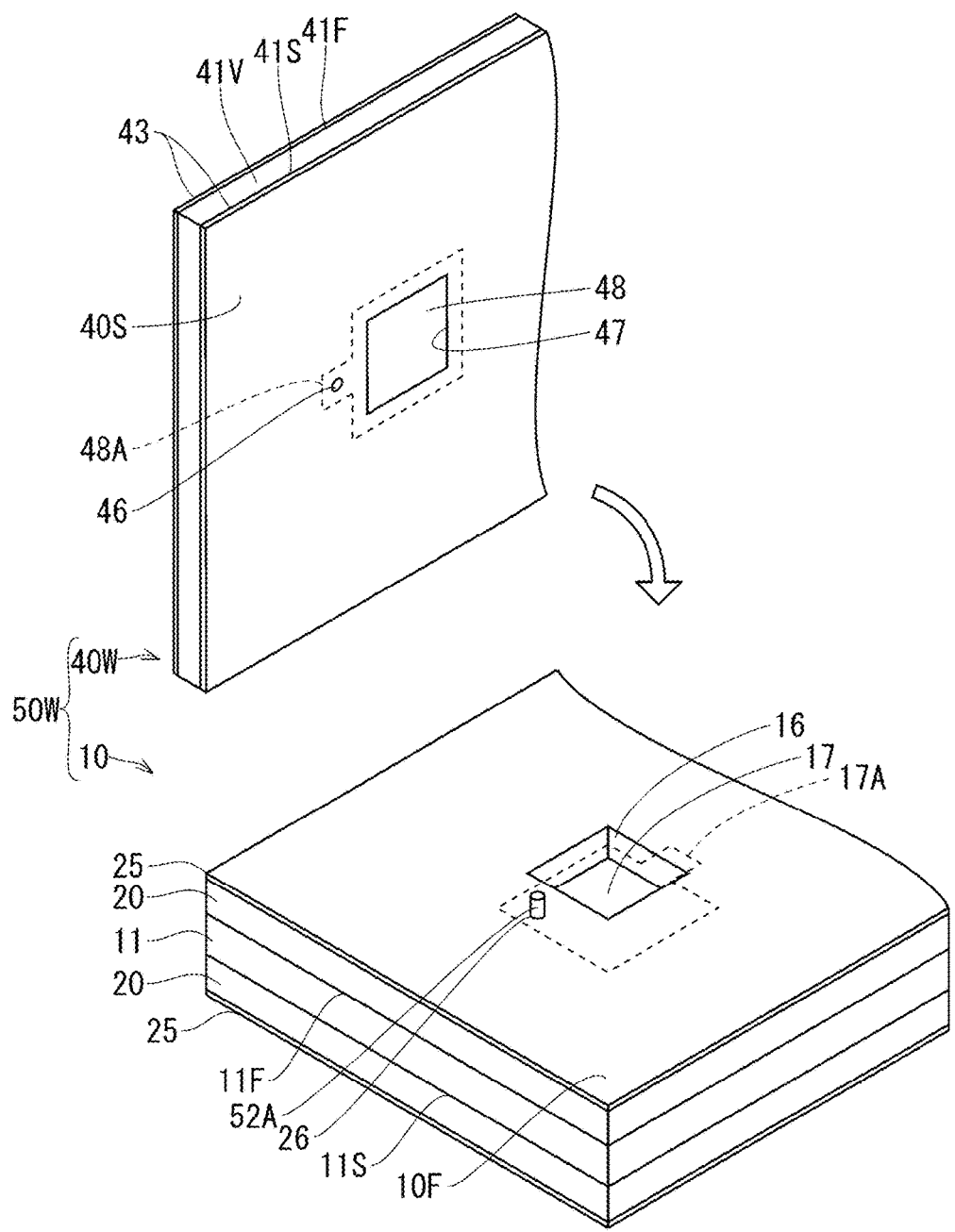
FIG. 13 is an exploded perspective view of the wiring substrate of the third embodiment.

Specifically, as illustrated in FIG. 13, only a pad 46 conducting to the second counter electrode 48 is provided on an S surface (40S) of the second substrate (40W), and only a pad 26 corresponding to the pad 46 of the second substrate (40W) is provided on the F surface (10F) of the first substrate 10. Then, the first substrate 10 and the second substrate (40W) are separately manufactured. A conductive post (52A) (for example, formed of Cu) protruding on the pad 26 on the F surface (10F) of the first substrate 10 is formed, for example, by plating, and a sheet-like anisotropic conductive adhesive in which an opening corresponding to the cavity 16 for a hollow space is formed is superposed on the F surface (10F) of the first substrate 10. Further, the S surface (40S) of the second substrate (40W) is superposed on the F surface (10F) of the first substrate 10, and the second substrate (40W) is pressed toward the first substrate 10 side. As a result, conductive particles (R) in the anisotropic conductive adhesive are sandwiched between the conductive post (52A) of the first substrate 10 and the pad 46 of the second substrate (40W). A circuit of the first substrate 10 and a circuit (specifically, the second counter electrode 48) of the second substrate (40W) are electrically connected to each other via the conductive particles (R). Other places are insulated by an insulating material in the anisotropic conductive adhesive. Then, as illustrated in FIG. 12, the F surface (10F) of the first substrate 10 and the S surface (40S) of the second substrate (40W) are fixed by the anisotropic conductive adhesive layer (38W) between the F surface (10F) and the S surface (40S). As a result, the wiring substrate (50W) is completed. When the anisotropic conductive adhesive layer (38W) is used for fixing the first substrate 10 and the second substrate (40W), by providing conductive convex parts on the substrates (10, 40W) as needed, the first substrate 10 and the second substrate (40W) can be easily electrically connected to each other.

Figure 14:
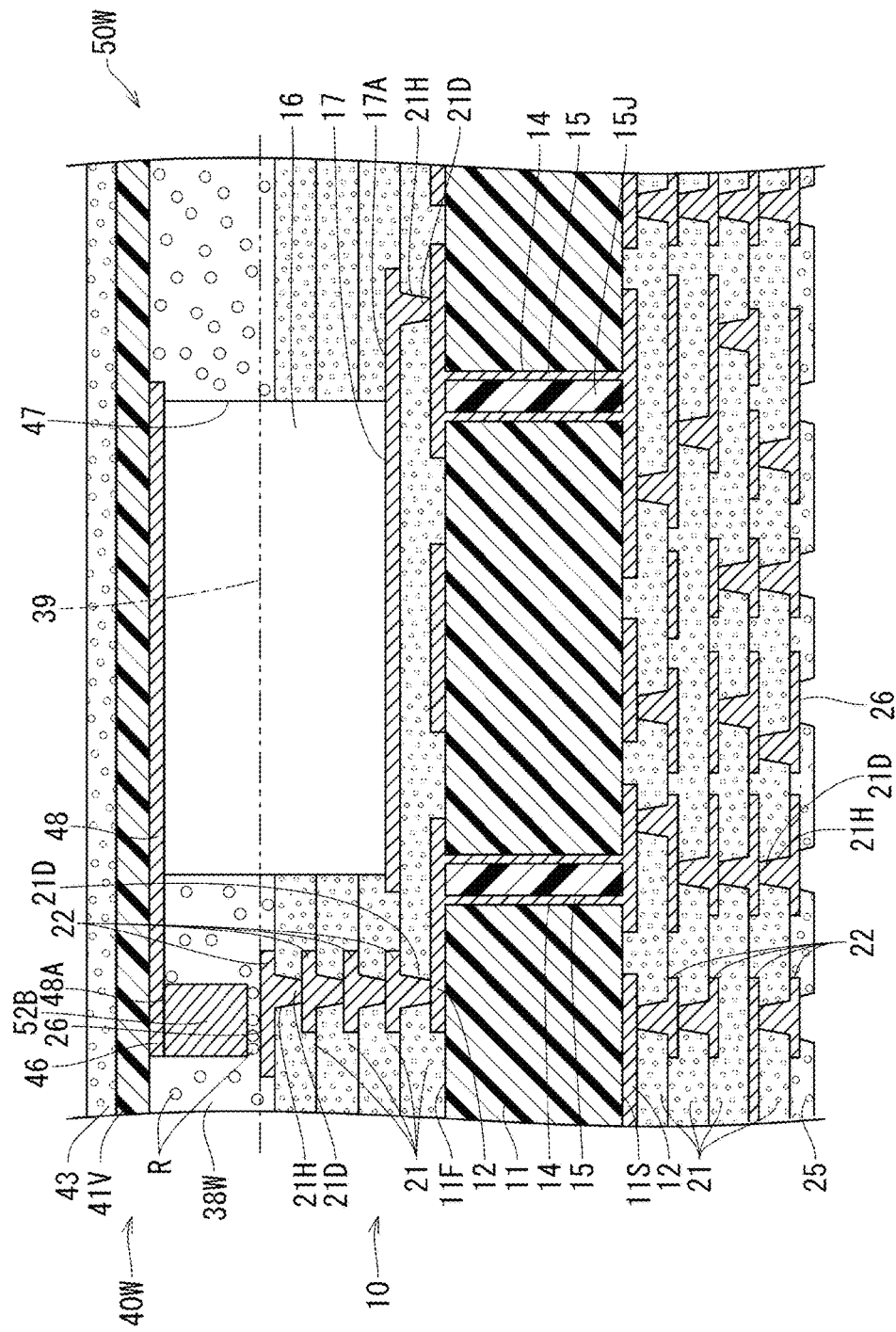
FIG. 14 is a cross-sectional side view of a wiring substrate according to the third embodiment.
Figure 15:
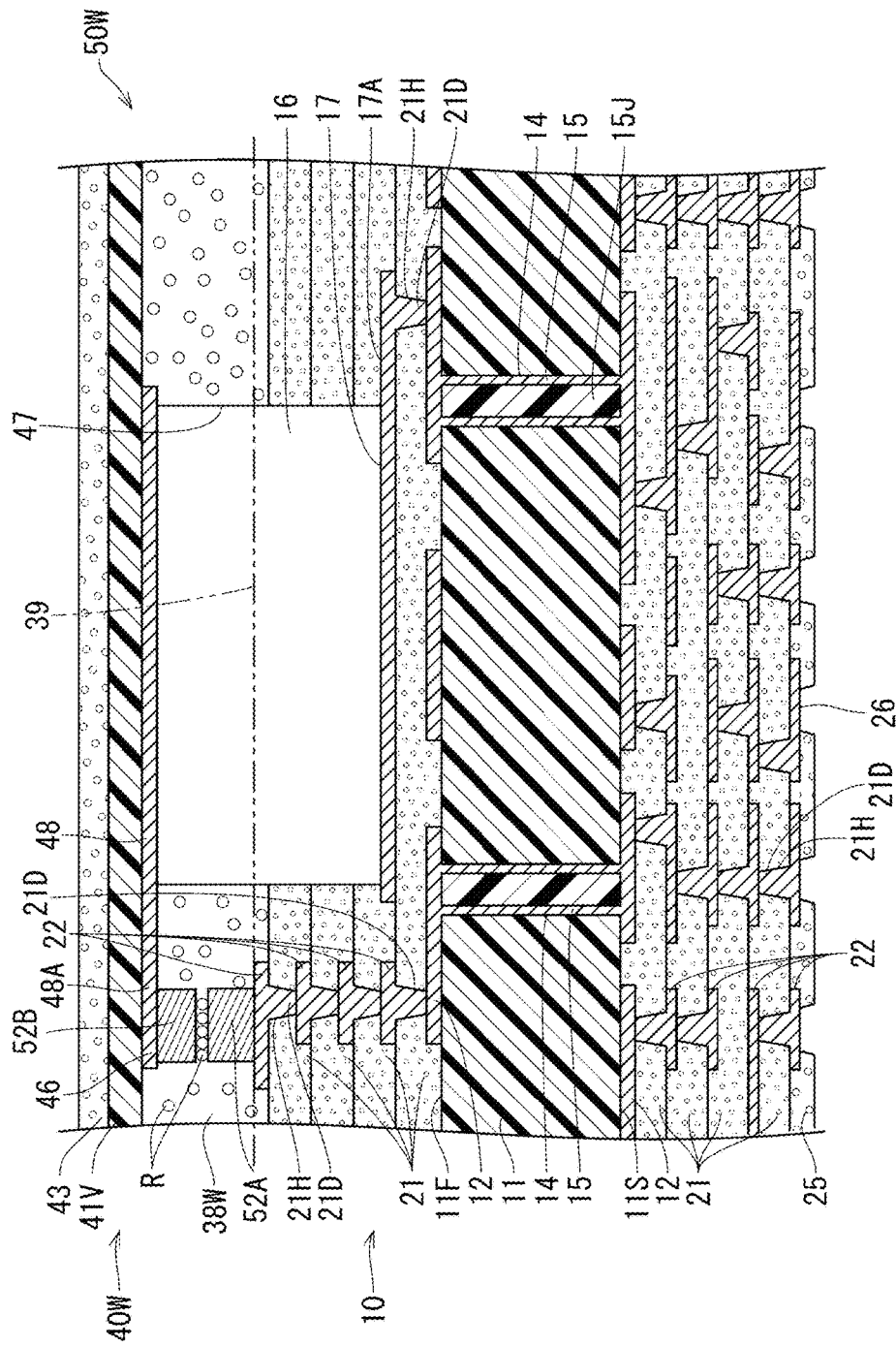
FIG. 15 is a cross-sectional side view of a wiring substrate according to the third embodiment.

As illustrated in FIG. 14, instead of forming a conductive post on the pad 26 of the first substrate 10, it is also possible to form a conductive post (52B) on the pad 46 on the S surface (40S) of the second substrate (40W). As illustrated in FIG. 15, it is also possible to respectively provide conductive posts (52A, 52B) on both the pad 26 of the first substrate 10 and the pad 46 of the second substrate (40W). It is possible to use the anisotropic conductive adhesive in which the conductive particles (R) gather to the conductive posts (52A, 52B). It is also possible to use a paste-like anisotropic conductive adhesive. Further, it is also possible to apply an adhesive (including an anisotropic conductive adhesive), a thermoplastic resin sheet (so-called hot melt adhesive), or a thermosetting resin sheet (for example, a prepreg) between the first substrate 10 and the second substrate (40W), and perform soldering between the conductive post (52A) and the pad 46 of the second substrate (40W), or between the pad 26 of the first substrate 10 and the pads 46 of the second substrate (40W). Specifically, for example, it is also possible that solder balls (38Z, 38Z) are formed on the pad 26 on the F surface (10F) of the first substrate 10 and the pad 46 on the S surface (40S) of the second substrate (40W), a resin sheet as a hot melt adhesive in which openings corresponding to the pad 26 and the cavity 16 for a hollow space are formed is laminated on the F surface (10F) of the first substrate 10, the second substrate (40W) is superposed on the resin sheet and is pressed and heated, and is cooled, and thereby the first substrate 10 and the second substrate (40W) are fixed. A damming part may be provided so that the adhesive does not drip into the cavity 16 for a hollow space.

Further, as in the case of the wiring substrate 50 of the first embodiment, it is also possible to have a structure in which the first substrate 10 and the second substrate 40, which are both rigid substrates, are superposed on each other, and the first substrate 10 and the second substrate 40 are fixed to each other by an adhesive. Further, it is also possible to have a structure in which the first substrate 10 and the second substrate 40 are fixed to each other by both a solder 38 and an adhesive.

Fourth Embodiment

Figure 16:
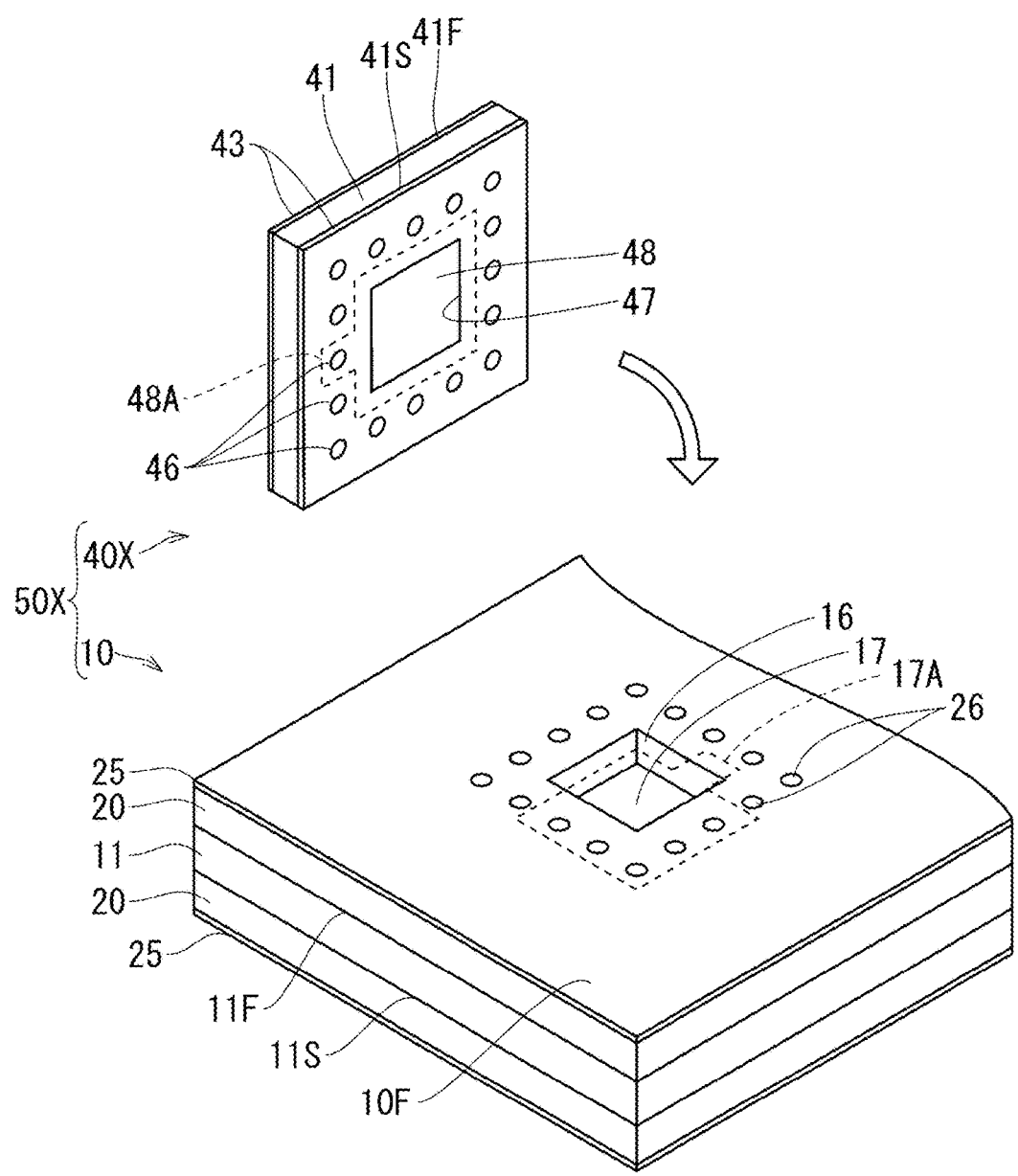
FIG. 16 is an exploded perspective view of a wiring substrate of a fourth embodiment.
Figure 17:
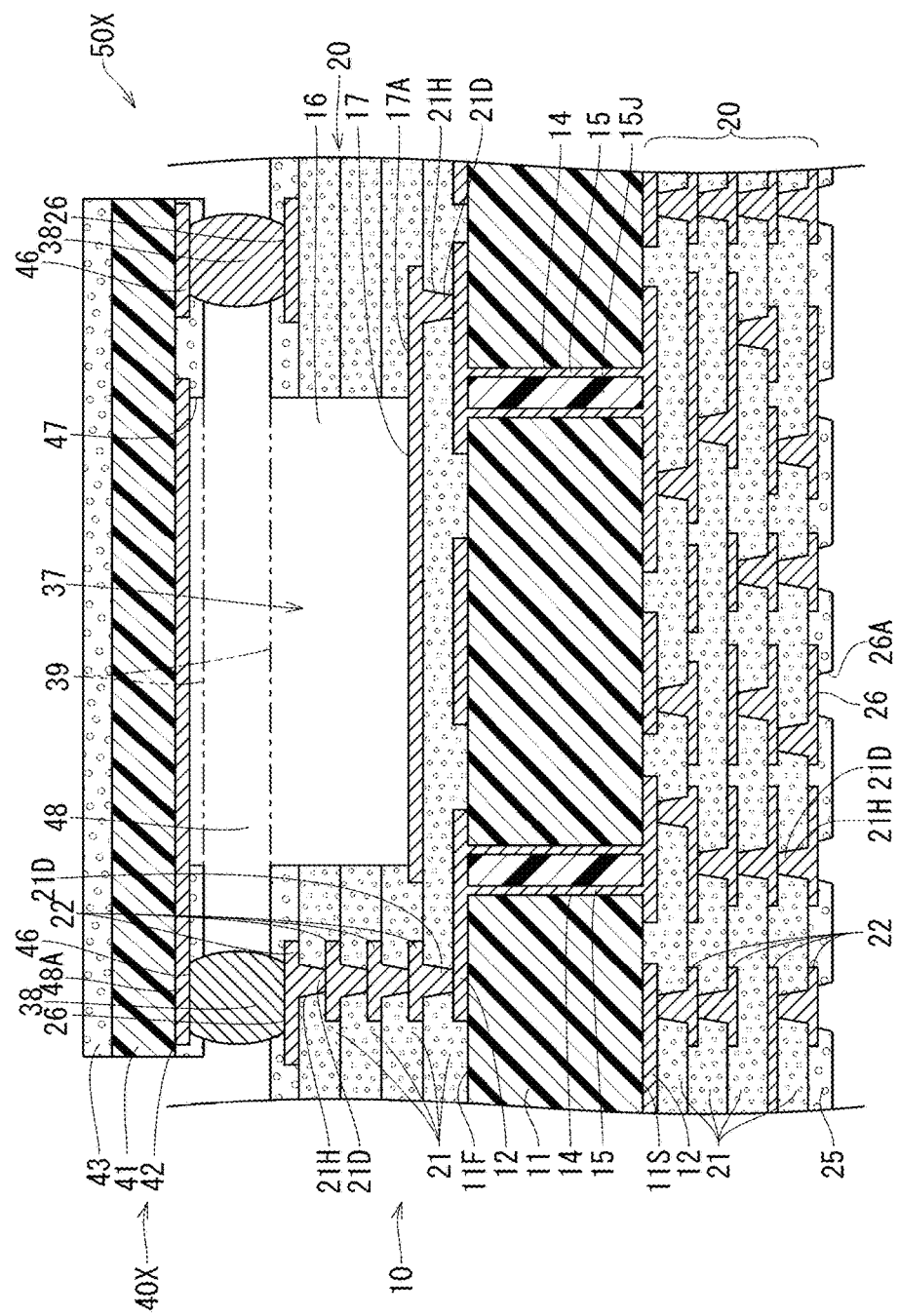
FIG. 17 is a cross-sectional side view of the wiring substrate of the fourth embodiment.

The present embodiment is illustrated in FIGS. 16 and 17. The wiring substrate 50 of the first embodiment has a structure in which the entire F surface (10F) of the first substrate 10 and the entire S surface (40S) of the second substrate 40 are exactly superposed on each other. However, as illustrated in FIG. 17, a wiring substrate (50X) of the present embodiment has a structure in which the entire S surface (40S) of a second substrate (40X) is superposed on a portion of the F surface (10F) of the first substrate 10. Specifically, as illustrated in FIG. 16, the second substrate (40X) of the present embodiment is obtained by cutting the second substrate 40 of the first embodiment illustrated in FIG. 1 into a quadrangular shape including the opening part 47 and the multiple pads 46 surrounding the opening part 47. Then, as illustrated in FIG. 17, the first substrate 10 and the second substrate (40X) are fixed to each other by the solders 38 between the pads (26, 46).

Fifth Embodiment

Figure 18:
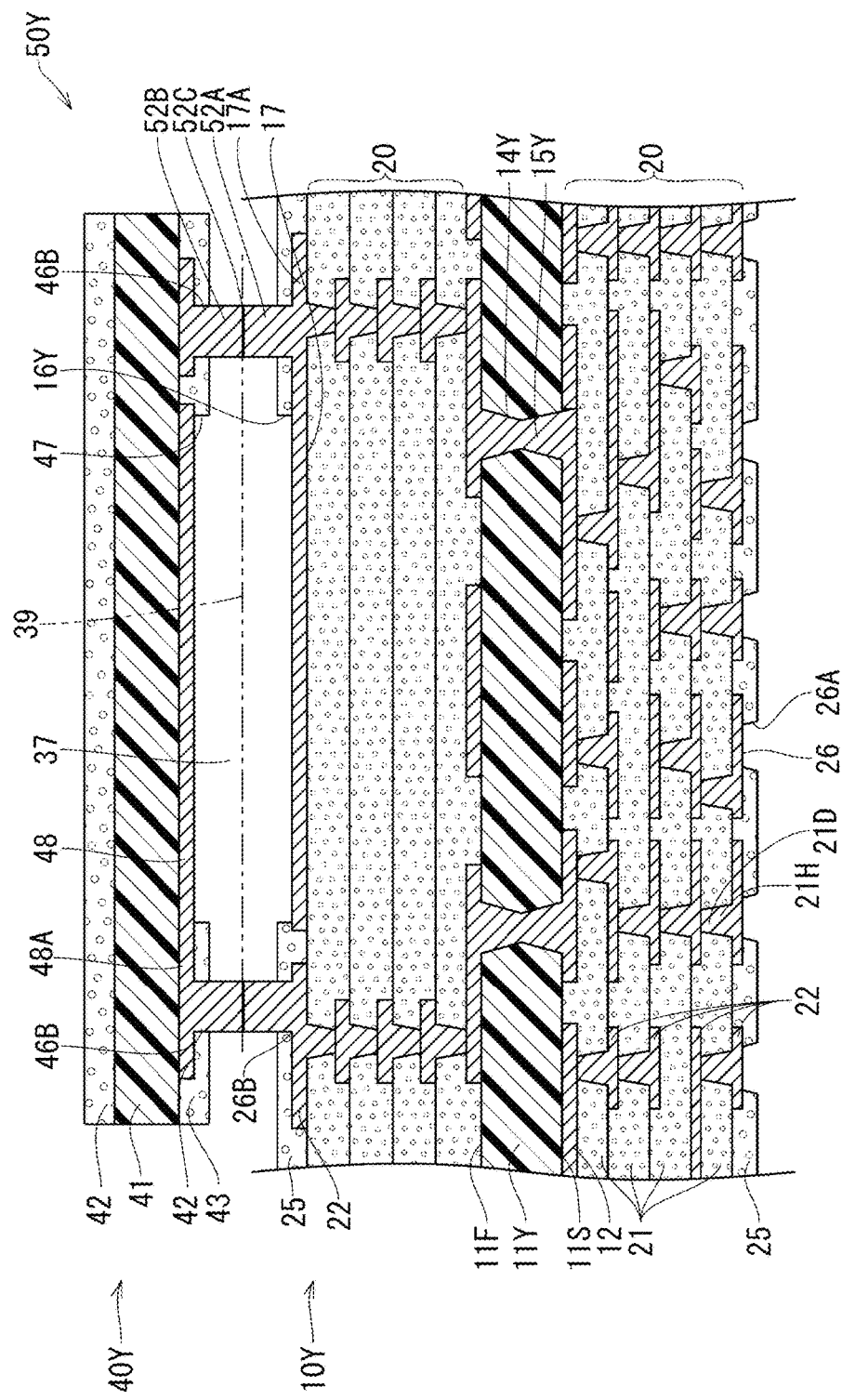
FIG. 18 is a cross-sectional side view of a wiring substrate of a fifth embodiment.
Figure 19:
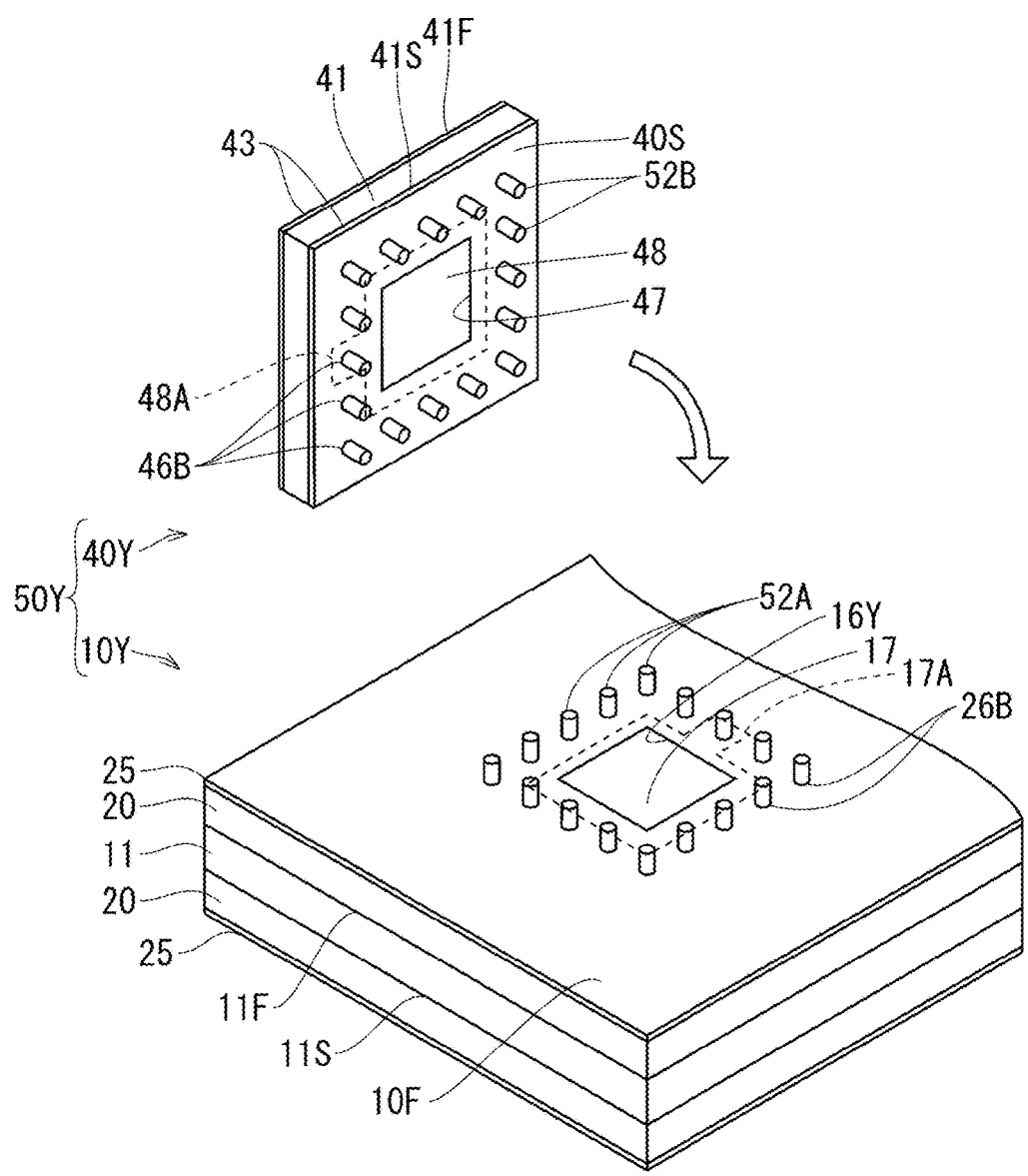
FIG. 19 is an exploded perspective view of the wiring substrate of the fifth embodiment.

The present embodiment is illustrated in FIGS. 18 and 19. As illustrated in FIG. 18, similar to the wiring substrate (50X) of the fourth embodiment, a wiring substrate (50Y) of the present embodiment has a second substrate (40Y) that is smaller than a first substrate (10Y). Further, in the first substrate (10Y), the first counter electrode 17 is provided in the outermost conductive circuit layer 22 on the F surface (10F) side, and an opening part (16Y) for exposing the first counter electrode 17 is formed in the solder resist layer 25.

Further, as illustrated in FIG. 19, on the F surface (10F) of the first substrate 10, multiple through holes (26B) are formed in a frame shape surrounding the opening part (16Y), and conductive posts (52A) (for example, formed of Cu) respectively protrude outward from the through holes (26B). As illustrated in FIG. 18, the conductive posts (52A) each form a columnar shape penetrating through a through hole (26B), and are each integrally formed with the conductive circuit layer 22.

Further, as illustrated in FIG. 19, multiple conductive posts (52B) (for example, formed of Cu) are provided also on the S surface (40S) of the second substrate (40Y) so as to surround the opening part 47. These conductive posts (52B) also each form a columnar shape penetrating through a through hole (46B) of the solder resist layer 43, and are each integrally formed with the conductive circuit layer 42 of the second substrate (40Y). Then, as illustrated in FIG. 18, front end surfaces of the multiple conductive posts (52A) of the first substrate (10Y) and front end surfaces of the multiple conductive posts (52B) of the second substrate (40Y) are respectively superposed on each other and are respectively fixed to each other by bonding members (52C) (for example, solders). An alloy layer composed of tin or nickel may be formed between the conductive posts (52A, 52B).

The conductive posts (52A, 52B) are formed by, for example, laminating a dry film on the pads (26, 46), forming openings in the dry film using laser, filling the openings of the dry film with plating by electroless plating and electrolytic plating, and removing the dry film.

Through-hole conductors (15Y) that are formed in the first substrate (10Y) of the present embodiment each have a middle-constricted shape. Specifically, in a core substrate (11Y), CO2 laser is irradiated from the F surface (11F) and from the S surface (11S) to form conical holes. Front ends of conical holes formed from the F surface (11F) side respectively communicate with front ends of conical holes formed from the S surface (11S) side, and middle-constricted electrical conduction through holes (14Y) are formed. The through-hole conductors (15Y) are formed by filling the electrical conduction through holes (14Y) with plating.

Sixth Embodiment

Figure 20:
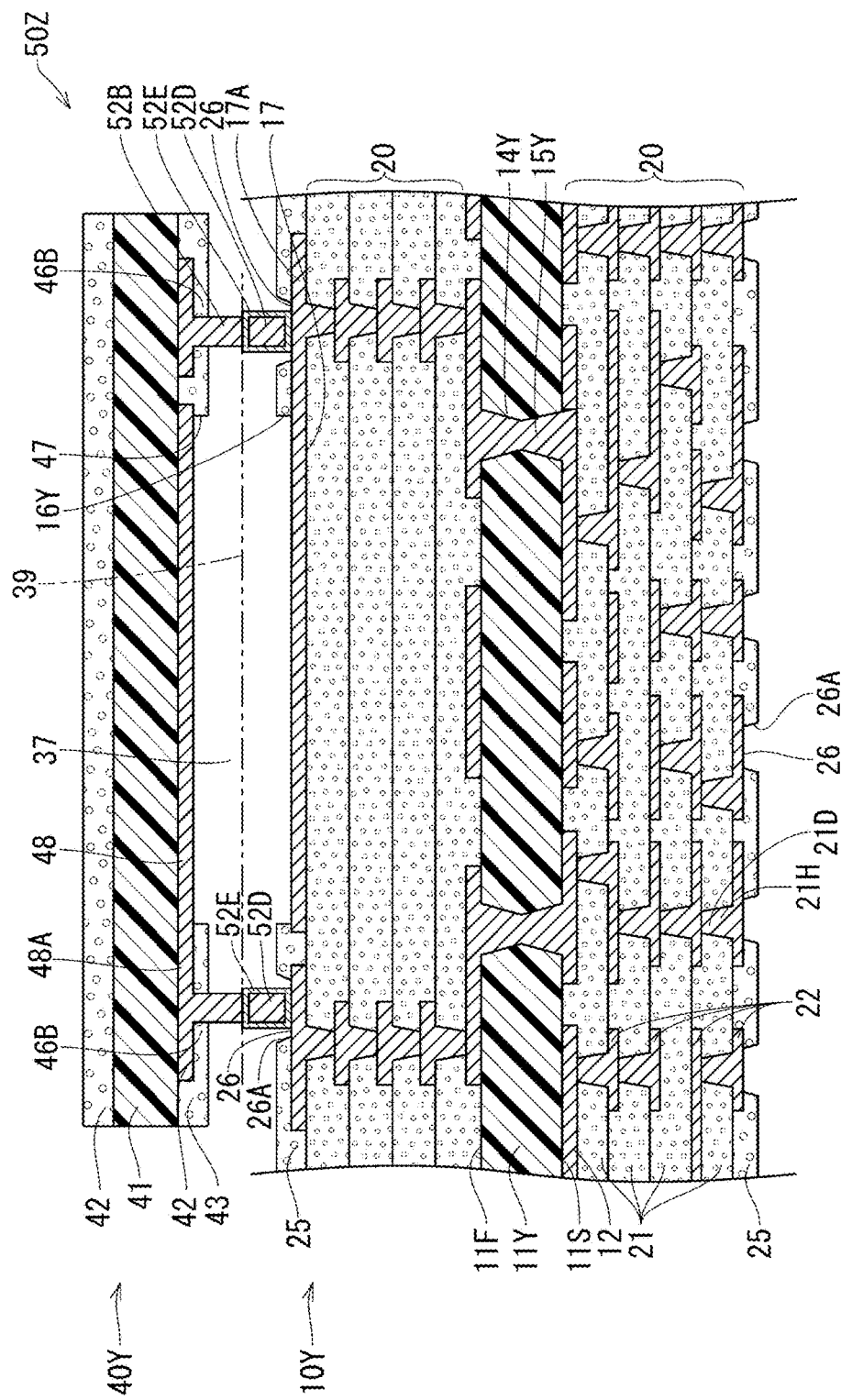
FIG. 20 is a cross-sectional side view of a wiring substrate of a sixth embodiment.

The present embodiment is illustrated in FIG. 20. In a wiring substrate (50Z) of the present embodiment, instead of the conductive posts (52A) of the first substrate (10Y) of the fifth embodiment, columnar pins (52D) (for example, formed of copper) coated with a bonding material (52E) are erected from pads 26 of a first substrate (10Z). These pins (52D) are fixed to the pads 26 of the first substrate (10Z) and the conductive posts (52B) of the second substrate (40Y) by the bonding material (52E). The pins (52D) are formed by, for example, mounting copper pins on the first substrate (10Z) using a mounter and performing reflow.

Seventh Embodiment

Figure 21:
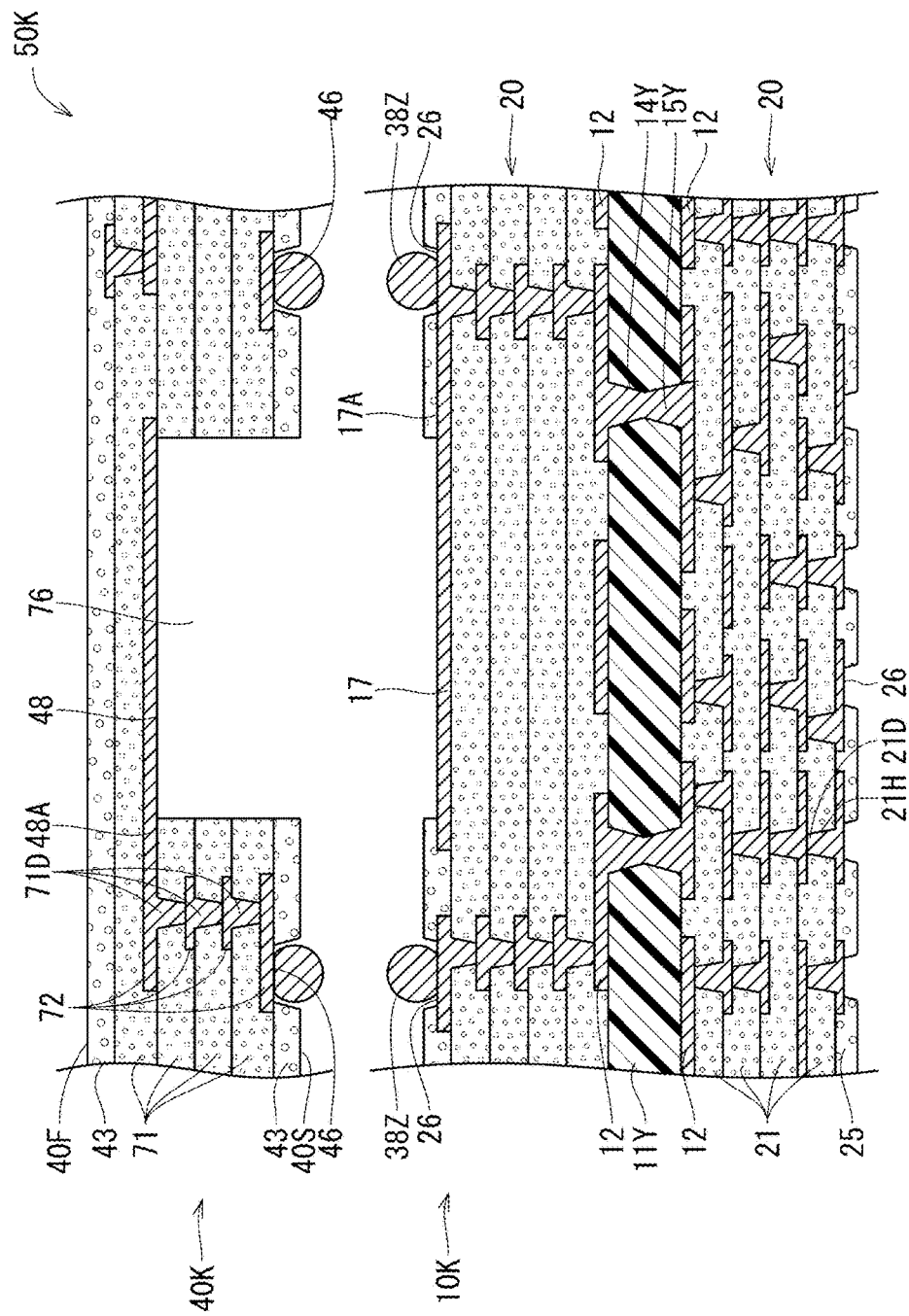
FIG. 21 is a cross-sectional side view of a first substrate and a second substrate of a wiring substrate of a seventh embodiment.
Figure 22:
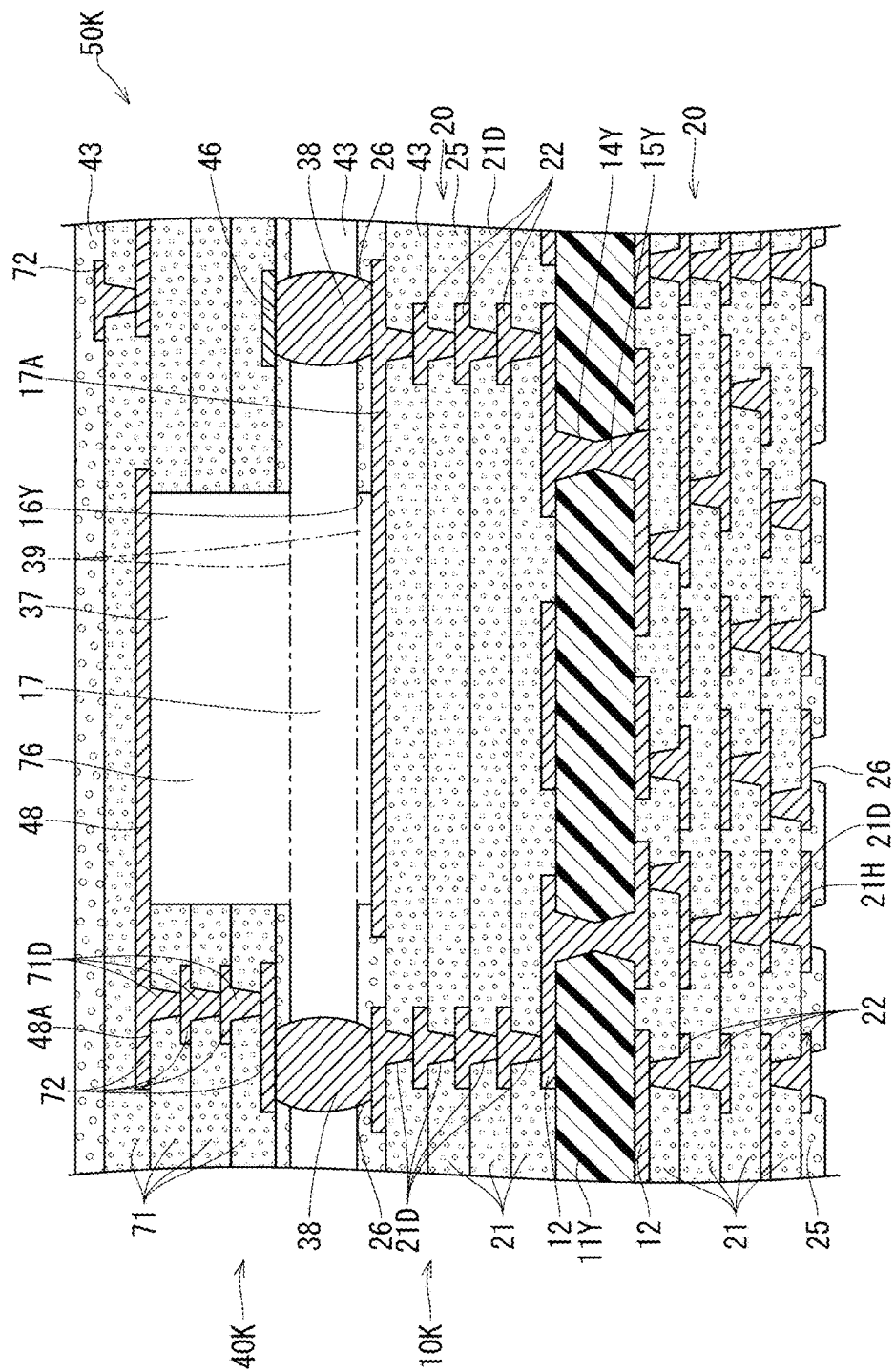
FIG. 22 is a cross-sectional side view of the wiring substrate of the seventh embodiment.

The present embodiment is illustrated in FIGS. 21 and 22. As illustrated in FIG. 21, a first substrate (10K) of a wiring substrate (50K) of the present embodiment has solder balls (38Z) on the pads 26 instead of the conductive posts (52A) of the first substrate (10Y) of the sixth embodiment. Similar to the outer surfaces of the first substrate 10 of the first embodiment illustrated in FIG. 1, on an outer surface on the F surface (10F) side of the first substrate (10K), the multiple pads 26 are formed and the solder balls (38Z) are provided on the pads 26.

On the other hand, a second substrate (40K) is formed by alternately laminating interlayer insulating layers 71 and conductive circuit layers 72, and respectively has solder resist layers (43, 43) on an F surface (40F) and an S surface (40S) of the entire second substrate (40K).

A cavity 76 for a hollow space that opens toward the S surface (40S) side is formed in the second substrate (40K). The cavity 76 for a hollow space is formed, for example, by removing a portion of the second substrate (40K) in a shape of a rectangular parallelepiped extending from the second interlayer insulating layer 71 from the F surface (40F) side to the solder resist layer 43 on the S surface (40S) side. Further, the above-described second counter electrode 48 is formed in the second conductive circuit layer 72 from the F surface (40F) side and covers a bottom surface of the cavity 76 for a hollow space.

Further, similar to the second substrate 40 of the first embodiment illustrated in FIG. 1, multiple pads 46 corresponding to the pads 26 of the first substrate (10K) are provided on the S surface (40S) of the second substrate (40K). Solder balls (38Z) are respectively provided on these pads 46. Then, as illustrated in FIG. 22, the pads (26, 46) of the first substrate (10K) and the second substrate (40K) are fixed by solders 38.

Eighth Embodiment

Figure 23:
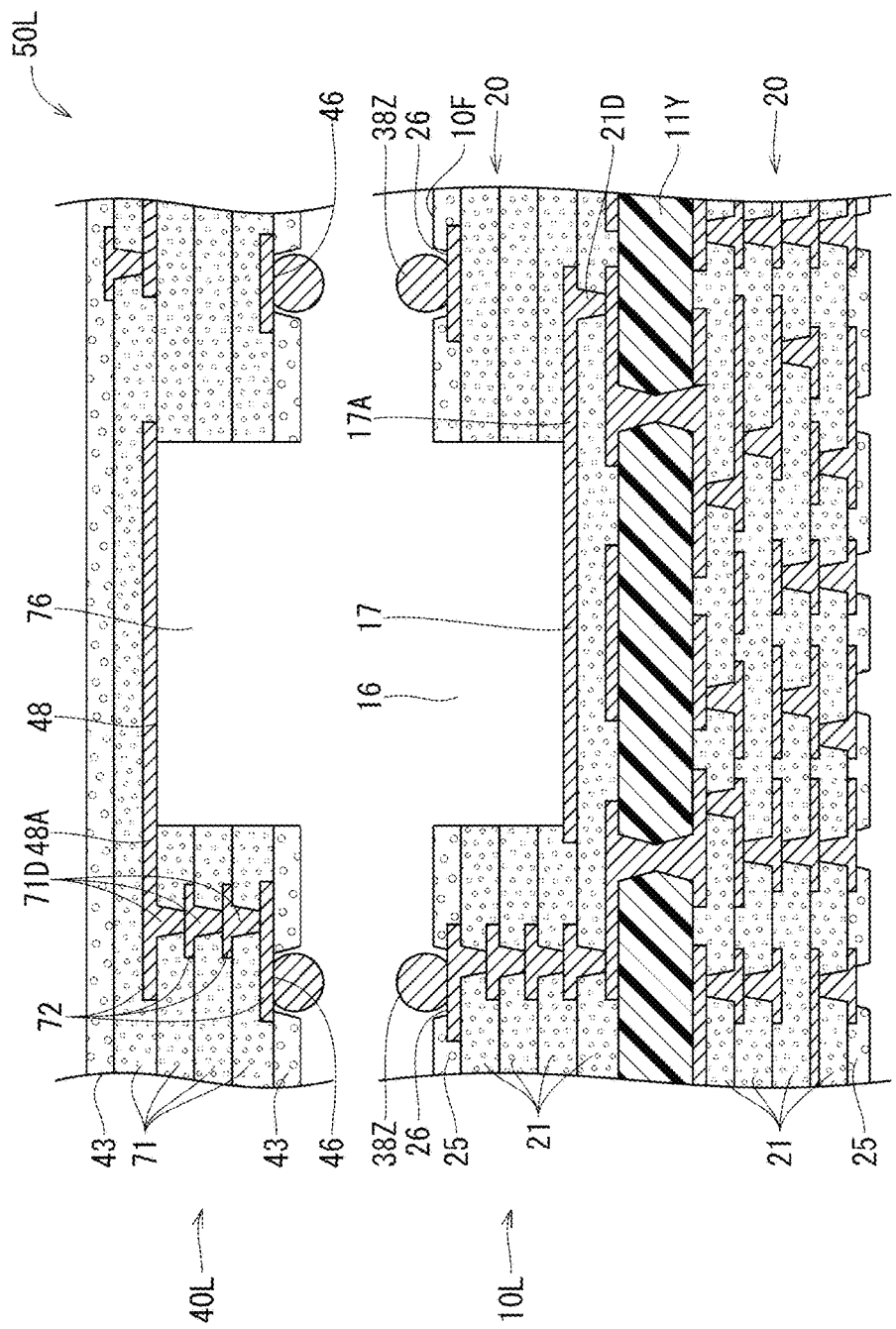
FIG. 23 is a cross-sectional side view of a first substrate and a second substrate of a wiring substrate of an eighth embodiment.

As illustrated in FIG. 23, a first substrate (10L) of a wiring substrate (50L) of the present embodiment has a structure in which the cavity 16 for a hollow space described in the first embodiment is provided in the build-up layer 20 on the F surface (10F) side of the first substrate (10K) of the seventh embodiment. That is, the hollow space part 37 includes the cavity 16 for a hollow space of the first substrate (10L) and a cavity 76 for a hollow space of a second substrate (40L). In other words, the dividing plane 39 intersects a middle portion of the hollow space part 37.

Ninth Embodiment

Figure 24:
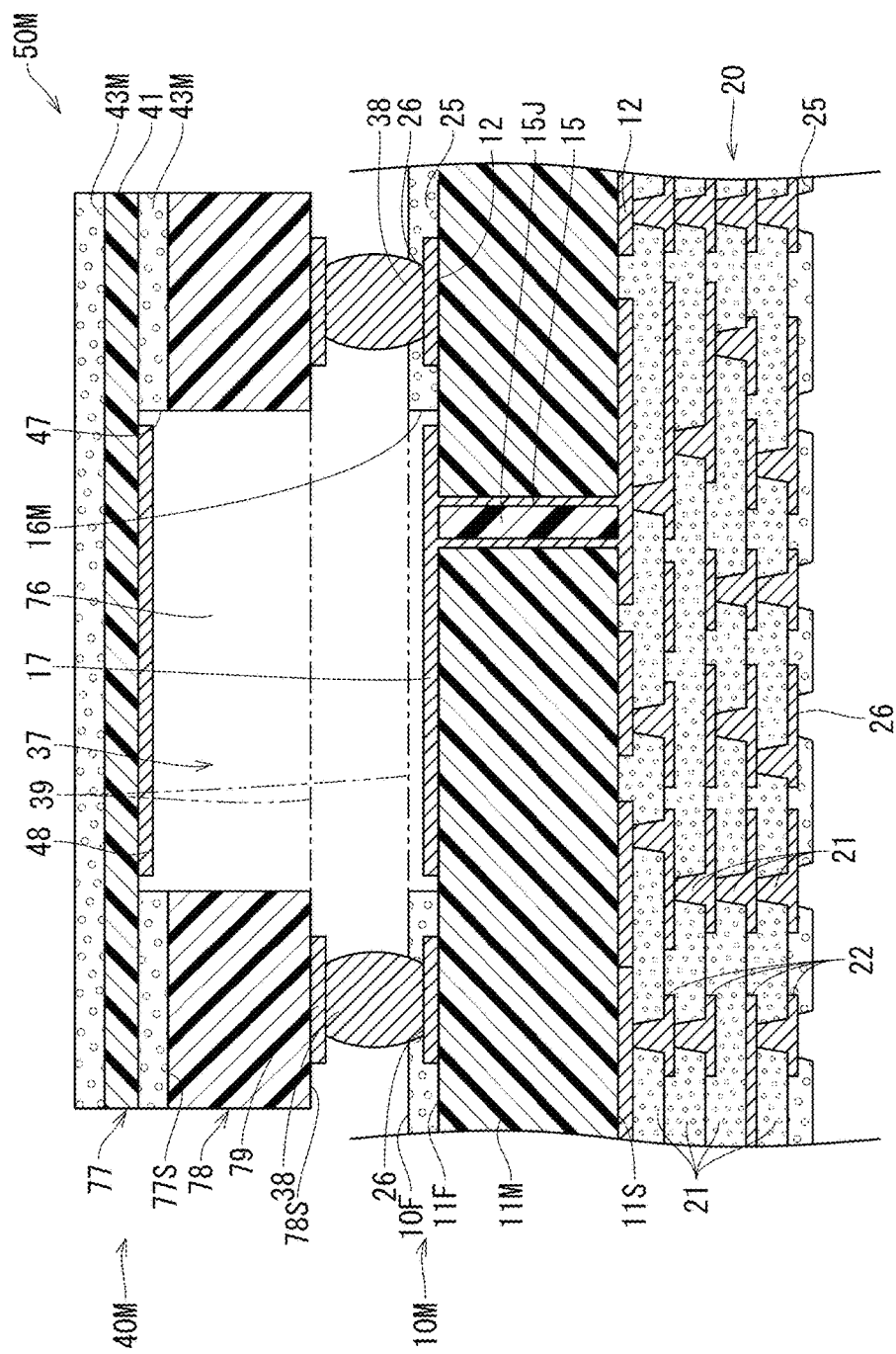
FIG. 24 is a cross-sectional side view of a wiring substrate of a ninth embodiment.

The present embodiment is illustrated in FIG. 24. Similar to the wiring substrates (50X, 50Y) of the fourth and fifth embodiments, a wiring substrate (50M) of the present embodiment has a second substrate (40M) that is smaller than a first substrate (10M). The first substrate (10M) has a build-up layer 20 only on an S surface (11S) side of a support base (11M). On an F surface (11F) side, a conductive circuit layer 12 on the support base (11M) is covered by a solder resist layer 25. Further, a first counter electrode 17 is provided in the conductive circuit layer 12 on the F surface (11F) side. An opening part (16M) exposing the first counter electrode 17 is formed in the solder resist layer 25. Further, multiple pads 26 are provided on the F surface (10F) of the first substrate (10M) so as to surround the opening part (16M).

The second substrate (40M) is formed by bonding a frame-shaped spacer 78 to an S surface (77S) of a main-body substrate 77. The main-body substrate 77 is a flexible substrate, similar to the second substrate (40V) of the second embodiment, and has a second counter electrode 48 on the S surface (41S) side of a support substrate 41. Instead of laminating the solder resist layers 43, coverlays (43M) are respectively laminated on both sides of the main-body substrate 77 of the second substrate (40M) via an adhesive (not illustrated in the drawings). The second counter electrode 48 is exposed in an opening part 47 of a coverlay (43M). Further, the spacer 78 is formed, for example, of an insulating resin, and is fixed to the main-body substrate 77 by an adhesive, and surrounds the opening part 47. A cavity 76 for a hollow space is formed in the second substrate (40M) from the opening part 47 of the main-body substrate 77 and an inner part of the spacer 78. A metal layer 79 is laminated on an S surface (78S) of the spacer 78 on an opposite side of the main-body substrate 77. The pads 26 of the first substrate (10M) are fixed to the metal layer 79 of the second substrate (40M) by solders 38, and a hollow space part 37 including the opening part (16M) and the cavity 76 for a hollow space is formed.

Other Embodiments

The present invention is not limited to the above-described embodiments. For example, the embodiments described below are also included in the technical scope of the present invention. Further, in addition to the embodiments described below, the present invention can also be embodied in various modified forms within the scope without departing from the spirit of the present invention.

(1) In the first embodiment, an example is described in which the first and second counter electrodes (17, 48) are used as a capacitive antenna. However, the first and second counter electrodes of the wiring substrate according to an embodiment of the present invention are not limited to being used as an antenna, but may also be used as a capacitor, and may also be used other purposes. Further, when the first and second counter electrodes (17, 48) are used as a capacitor, in the wiring substrate according to an embodiment of the present invention, since the material between the first and second counter electrodes (17, 48) is air and has a dielectric constant, charge and discharge times to or from the capacitor can be shortened.

(2) It is also possible to form a cavity 16 for a hollow space that penetrates the core substrate 11. In this case, it is possible to form the cavity 16 for a hollow space by removing a portion of the core substrate 11 and a portion of a build-up layer 20 on one side, removing a portion of the core substrate 11 and portions of the build-up layers 20 on both sides.

(3) In the wiring substrates of the first-eighth embodiments, a circuit of the first substrate and a circuit of the second substrate are electrically connected to each other by the solders 38 provided on the dividing plane 39. However, it is not necessary for the first substrate and the second substrate to be electrically connected on the dividing plane.

(4) In the wiring substrates of the first-eighth embodiments, the first and second counter electrodes are exposed in the hollow space part. However, it is also possible to have a structure in which the first or second counter electrode is not exposed in the hollow space part. Specifically, it is also possible to have a structure in which the opening part 47 is not provided in the second substrate 40 of the first embodiment and the second counter electrode 48 faces the hollow space part 37 across the solder resist layer 43, or a structured in which the first counter electrode 17 is provided in the conductive circuit layer 12 and faces the hollow space part 37 across the first interlayer insulating layer 21.

A wiring substrate according to an embodiment of the present invention allows a dielectric constant between a pair of counter electrodes to be lowered as compared to a wiring substrate Japanese Patent Laid-Open Publication No. 2007-88409.

A wiring substrate according to an embodiment of the present invention includes: multiple conductive circuit layers laminated via insulating layers; first and second counter electrodes that oppose each other and are respectively provided in first and second conductive circuit layers among the multiple conductive circuit layers; a hollow space part positioned between the first and second counter electrodes; a dividing plane that intersects the hollow space part and divides the wiring substrate into a first substrate that includes the first conductive circuit layer and a second substrate that includes the second conductive circuit layer; and a substrate fixing part that fixes the first substrate and the second substrate to each other in a state in which the first substrate and the second substrate are superposed on each other.

A method for manufacturing a wiring substrate according to another embodiment of the present invention relates to a wiring substrate including multiple conductive circuit layers laminated via insulating layers and first and second counter electrodes opposing each other respectively provided in first and second conductive circuit layers among the multiple conductive circuit layers, and includes: providing a hollow space part between the first and second counter electrodes; separately forming a first substrate and a second substrate, the first substrate including the first conductive circuit layer on one side of a dividing plane that intersects the hollow space part, and the second substrate including the second conductive circuit layer on the other side of the dividing plane; and superposing the first substrate and the second substrate on each other and fixing the first substrate and the second substrate to each other.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
   a first substrate comprising a first conductive circuit layer;
   a second substrate comprising a second conductive circuit layer; and
   a substrate fixing structure fixing the first substrate and the second substrate to each other such that the first substrate and the second substrate are superposed on each other,
   wherein the first conductive circuit layer in the first substrate includes a first counter electrode, the second conductive circuit layer in the second substrate includes a second counter electrode, and the first and second substrates have a hollow space formed such that the first and second counter electrodes are positioned to oppose each other across the hollow space and that the first and second substrates have a dividing plane intersecting the hollow space and dividing the first and second substrates.

2. A wiring substrate according to claim 1, wherein the first and second substrates are formed such that the first and second substrates have the dividing plane intersecting an end of the hollow space on a second substrate side.

3. A wiring substrate according to claim 1, wherein the first and second substrates are formed such that the first and second substrates have the dividing plane intersecting a middle portion of the hollow space.

4. A wiring substrate according to claim 1, wherein the first substrate comprises a first rigid substrate, and the second substrate comprises a second rigid substrate.

5. A wiring substrate according to claim 1, wherein the first and second substrates are formed such that one of the first and second substrates comprises a spacer having a penetrating hole and a main-body substrate laminated to the spacer and closing one end of the penetrating hole of the spacer, that the other one of the first and second substrates has a surface over an opposite end of the penetrating hole of the spacer and that the hollow space including the penetrating hole of the spacer is formed between the first and second counter electrodes.

6. A wiring substrate according to claim 1, wherein the first substrate comprises a rigid substrate, and the second substrate comprises a flexible substrate.

7. A wiring substrate according to claim 6, wherein the first substrate comprises the rigid substrate having a cavity, and the second substrate comprises the flexible substrate having a surface over an opening end of the cavity such that the hollow space including the cavity is formed between the first and second counter electrodes.

8. A wiring substrate according to claim 7, wherein the rigid substrate of the first substrate comprises a laminated structure comprising a plurality of insulating layers and a plurality of conductive layers such that the cavity is a removed portion of the laminated structure.

9. A wiring substrate according to claim 1, wherein the first and second substrates are formed such that the hollow space is formed in a laminated structure comprising a plurality of insulating layers and a plurality of conductive layers.

10. A wiring substrate according to claim 1, wherein the first and second substrates are formed such that the hollow space is formed in a single layer structure.

11. A wiring substrate according to claim 1, wherein the first and second substrates are formed such that at least one of the first and second counter electrodes is exposed in the hollow space.

12. A wiring substrate according to claim 1, wherein the first and second substrates comprise insulating layers, respectively, and the first and second substrates are formed such that at least one of the first and second counter electrodes is covered by a respective one of the insulating layers in the hollow space.

13. A wiring substrate according to claim 1, wherein the first and second substrates comprise a plurality of pads formed on surfaces facing each other, and the substrate fixing structure comprises a plurality of solder structures formed on the plurality of pads such that the plurality of solder structures is connecting the first and second substrates.

14. A wiring substrate according to claim 1, wherein the substrate fixing structure comprises an anisotropic conductive adhesive layer such that the anisotropic conductive adhesive layer is connecting the first and second substrates.

15. A wiring substrate according to claim 13, wherein the first substrate comprises a first rigid substrate, and the second substrate comprises a second rigid substrate.

16. A wiring substrate according to claim 13, wherein the first substrate comprises a rigid substrate, and the second substrate comprises a flexible substrate.

17. A method for manufacturing a wiring substrate, comprising:
    forming a first substrate comprising a first conductive circuit layer including a first counter electrode;
    forming a second substrate comprising a second conductive circuit layer including a second counter electrode;
    positioning the first substrate and the second substrate such that the first substrate and the second substrate are superposed with respect to each other and form a hollow space between the first and second counter electrodes and a dividing plane intersecting the hollow space; and
    forming a substrate fixing structure between the first and second substrates such that the substrate fixing structure connects the first and second substrates and fixes the first substrate on a first side of the dividing plane, the second substrate on a second side of the dividing plane on an opposite side with respect to the first side, and the first and second electrodes positioned across the hollow space.

18. A method for manufacturing a wiring substrate according to claim 17, wherein the second substrate is a flexible substrate, and the positioning of the first substrate and the second substrate comprises positioning the first substrate and the second substrate such that the first and second substrates have the dividing plane intersecting an end of the hollow space on a second substrate side.

19. A method for manufacturing a wiring substrate according to claim 17, wherein the forming of the first substrate comprises forming the first substrate having a cavity, and the positioning of the first substrate and the second substrate comprises positioning the first substrate and the second substrate such that the second substrate has a surface over an opening end of the cavity and that the hollow space including the cavity is formed between the first and second counter electrodes.

20. A method for manufacturing a wiring substrate according to claim 17, wherein the first and second substrates are formed such that one of the first and second substrates comprises a spacer having a penetrating hole and a main-body substrate laminated to the spacer and closing one end of the penetrating hole of the spacer, that the other one of the first and second substrates has a surface over an opposite end of the penetrating hole of the spacer and that the hollow space including the penetrating hole of the spacer is formed between the first and second counter electrodes.

* * * * *